US012581924B2

(12) United States Patent　　　　　(10) Patent No.: US 12,581,924 B2
Holland　　　　　　　　　　　　　　　　(45) Date of Patent: Mar. 17, 2026

(54) METAL NITRIDE DIFFUSION BARRIER AND METHODS OF FORMATION

(71) Applicant: Taiwan Semiconductor Manufacturing Company, Ltd., Hsinchu (TW)

(72) Inventor: Martin Christopher Holland, San Jose, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 206 days.

(21) Appl. No.: 17/302,794

(22) Filed: May 12, 2021

(65) Prior Publication Data

US 2022/0367260 A1　　Nov. 17, 2022

(51) Int. Cl.
　　*H01L 21/768*　　(2006.01)
　　*H01L 21/285*　　(2006.01)
　　*H01L 23/532*　　(2006.01)
　　*H01L 23/522*　　(2006.01)
(52) U.S. Cl.
　　CPC .. *H01L 21/76843* (2013.01); *H01L 21/28568* (2013.01); *H01L 21/76846* (2013.01); *H01L 23/53238* (2013.01); *H01L 23/53266* (2013.01); *H01L 23/5226* (2013.01)
(58) Field of Classification Search
　　CPC ......... H01L 23/53266; H01L 23/53238; H01L 21/28568; H01L 21/76843; H01L 21/28562; H01L 21/76877; H01L 2924/00; H01L 31/1013; H01L 21/76846; H01L 21/76849

See application file for complete search history.

(56) References Cited

U.S. PATENT DOCUMENTS

2010/0193956 A1 *　8/2010　Kim ................... H01L 21/76856
　　　　　　　　　　　　　　　　　　　　　　　　438/653
2017/0309513 A1 *　10/2017　Zhou ................. H01L 21/76814
2019/0214296 A1 *　7/2019　Wang ................ H01L 21/76879
2020/0006230 A1　　1/2020　Tsai et al.
2023/0377961 A1　　11/2023　Holland

* cited by examiner

*Primary Examiner* — Tony Tran

(74) *Attorney, Agent, or Firm* — Harrity & Harrity, LLP

(57) ABSTRACT

Metal nitride diffusion barriers may be included between cobalt-based structures and ruthenium-based structures to reduce, minimize, and/or prevent intermixing of cobalt into ruthenium. A metal nitride diffusion barrier layer may include a cobalt nitride ($CoN_x$), a ruthenium nitride ($RuN_x$), or another metal nitride that has a bond dissociation energy greater than the bond dissociation energy of cobalt to cobalt (Co—Co), and may therefore function as a strong barrier to cobalt migration and diffusion into ruthenium. Moreover, cobalt nitride and ruthenium nitride have lower resistivity relative to other materials such as titanium nitride (TiN), tungsten nitride (WN), and tantalum nitride (TaN). In this way, the metal nitride diffusion barriers are capable of minimizing cobalt diffusion and intermixing into ruthenium-based interconnect structures while maintaining a low contact resistance for the interconnect structures. This may increase semiconductor device performance, may increase semiconductor device yield, and may enable further reductions in interconnect structure size.

20 Claims, 35 Drawing Sheets

200

226
252
224

222
248
220

218
244
216

238
214

212

210

208

206

254

250

246

240

230
234

242

232
236

228
204

202

1410    Form a recess in a dielectric layer

1420    Perform a surface treatment operation on a bottom surface in the recess to form a diffusion barrier layer on the bottom surface 1430    Deposit a layer over the diffusion barrier layer in the recess to form an interconnect structure

1400

1510 Form an opening through a dielectric layer

1520 Perform one or more cycles of a combination of a surface treatment operation and a deposition operation to form a diffusion barrier layer on a bottom surface in the opening 1530 Deposit a layer over the diffusion barrier layer in the opening to form an interconnect structure

1500

METAL NITRIDE DIFFUSION BARRIER AND METHODS OF FORMATION

BACKGROUND

An electronic device (e.g., a processor, a memory) may include various intermediate and backend layers or regions in which individual semiconductor devices (e.g., transistors, capacitors, resistors) are interconnected by interconnect structures. The interconnect structures may include metallization layers (also referred to as wires), vias that connect the metallization layers, contact plugs, and/or trenches, among other examples. A trench and a via may be formed during the same fabrication process referred to as a dual damascene process. In a dual damascene process, a via and a trench are etched using either a via-first procedure or a trench-first procedure. Then, the trench and the via are filled with a conductive material in the same deposition operation (e.g., electroplating).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
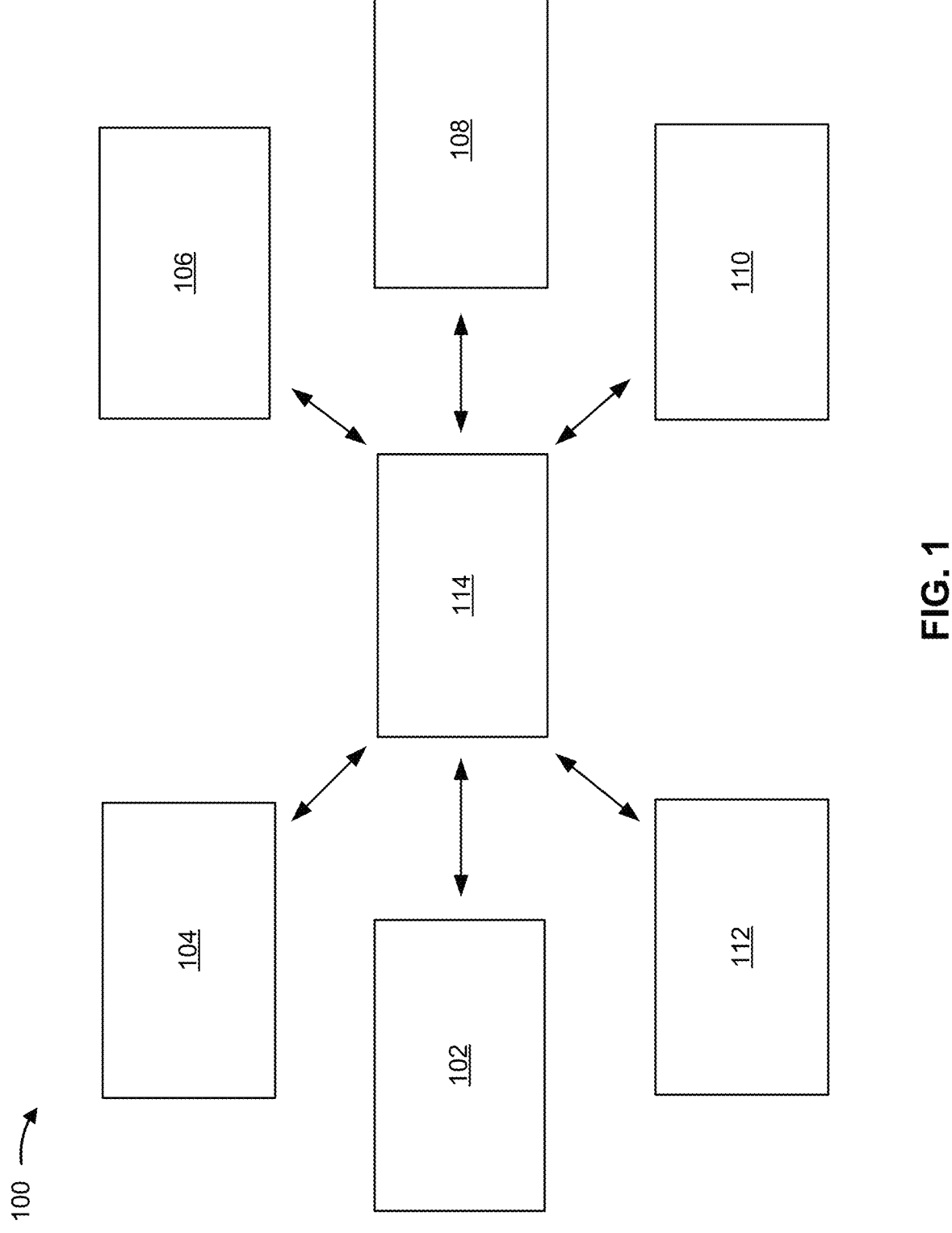
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor processing nodes decrease in size, cobalt has become a viable alternative to tungsten for semiconductor interconnect structures because of the larger grain size and fewer impurities of cobalt. Moreover, cobalt may enable thinner copper diffusion barriers relative to other conductive materials, which may further reduce contact resistance and sheet resistance of a semiconductor interconnect structure. While cobalt-based semiconductor interconnect structures may enable further semiconductor processing node advancements, the use of cobalt may introduce various back end of line (BEOL) issues such as intermixing between ruthenium-based BEOL structures and cobalt-based interconnects, poor copper reflow performance for copper-based BEOL on cobalt-based interconnect structures, and/or other issues.

Some implementations described herein provide techniques and apparatuses for metal nitride diffusion barriers that may be included between cobalt-based structures and ruthenium-based structures to reduce, minimize, and/or prevent intermixing of cobalt into ruthenium. A metal nitride diffusion barrier layer may include a cobalt nitride ($CoN_x$), a ruthenium nitride ($RuN_x$), or another metal nitride that has a bond dissociation energy greater than the bond dissociation energy of cobalt to cobalt (Co—Co), and may therefore function as a strong barrier to cobalt migration and diffusion into ruthenium. Moreover, cobalt nitride and ruthenium nitride have lower resistivity relative to other materials such as titanium nitride (TiN), tungsten nitride (WN), and tantalum nitride (TaN). In this way, the metal nitride diffusion barriers are capable of minimizing cobalt diffusion and intermixing into ruthenium-based interconnect structures while maintaining a low contact resistance for the interconnect structures. This may increase semiconductor device performance, may increase semiconductor device yield, and may enable further reductions in interconnect structure size.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing and/or manufacturing facility, and/or another type of semiconductor processing environment.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated material handling system (AMHS), and/or another type of device or system that is used to transport wafers and/or dies between semiconductor processing tools 102-112 and/or to and from other locations such as a wafer rack, a storage room. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
FIG. 2 is a diagram of a portion of an example electronic device described herein.

FIG. 2 is a diagram of a portion of an example electronic device 200 described herein. The device 200 includes an example of a memory device (e.g., a static random access memory (SRAM), a dynamic random access memory (DRAM)), a logic device, a processor, an input/output device, or another type of semiconductor device that includes one or more transistors.

As shown in FIG. 2, the device 200 includes a substrate 202, which includes a silicon (Si) substrate, a substrate formed of a material including silicon, a III-V compound semiconductor material substrate such as gallium arsenide (GaAs), a silicon on insulator (SOI) substrate, or another type of semiconductor substrate. In some implementations, a fin structure 204 is formed in the substrate 202. In this way, the transistors included in the device 200 include fin field-effect transistors (finFETs). In some implementations, the device 200 includes other types of transistors, such as gate all around (GAA) transistors, planar transistors, and/or other types of transistors.

The device 200 includes one or more stacked layers, including a dielectric layer 206, an etch stop layer (ESL)

208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride (SiN$_x$), an oxide (e.g., a silicon oxide (SiO$_x$) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200.

As further shown in FIG. 2, the device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the device 200.

The epitaxial regions 228 are electrically connected to metal source or drain contacts 230 of the transistors included in the device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide (SiO$_x$), a silicon nitride (Si$_x$N$_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The metal source or drain contacts 230 are electrically connected to source or drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 includes additional metallization layers and/or vias that connect the device 200 to a package.

As indicated above, FIG. 2 is provided as an example. Other examples may differ from what is described with regard to FIG. 2.

Figure 3:
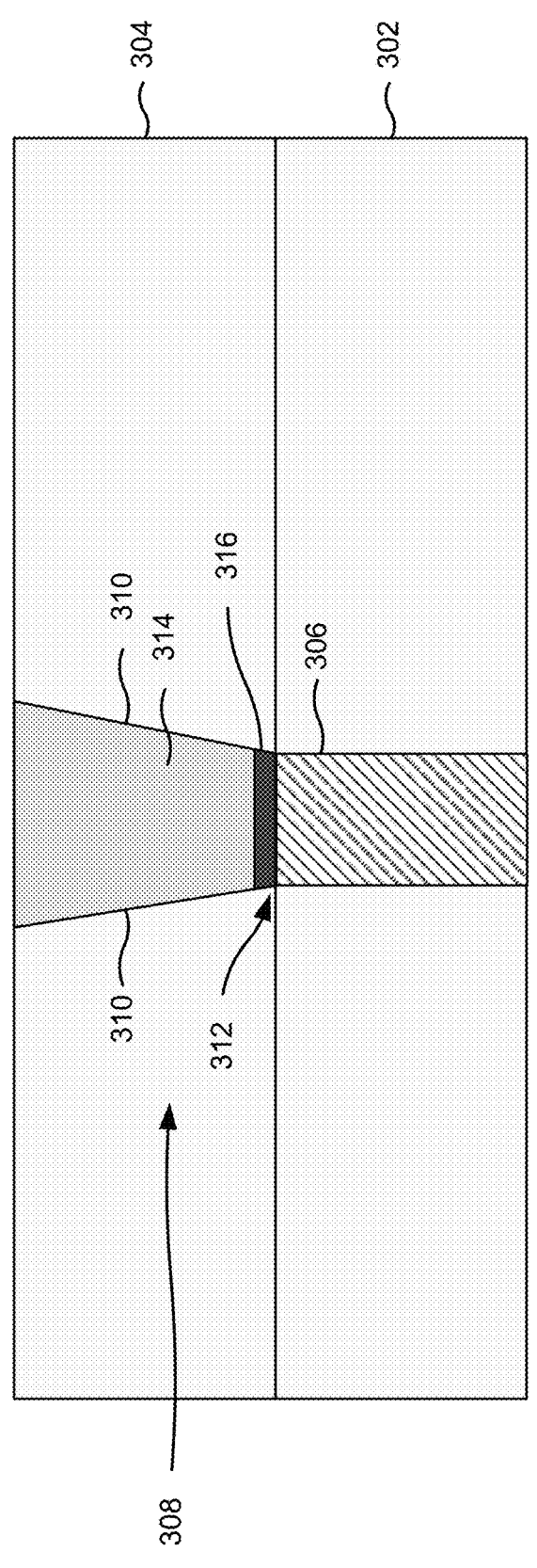
FIG. 3 is a diagram of an example portion of an electronic device described herein.

FIG. 3 is a diagram of an example portion 300 of an electronic device described herein. The example portion 300 may include a portion of the electronic device 200 and/or a portion of another type of electronic device. The example portion 300 may include a dielectric layer 302 and another dielectric layer 304 over and/or on the dielectric layer 302. The dielectric layers 302 and 304 may correspond to one or more of the dielectric layers 206, 210, 214, 218, 222, 226 of the electronic device 200. In some implementations, the dielectric layers 302 and 304 are not separate dielectric layers but, rather, a single dielectric layer.

A conductive structure 306 may be included in the dielectric layer 302. The conductive structure 306 may correspond to a source or drain contact 230 a gate 232, a source or drain interconnect 238, a gate interconnect 240, a BEOL metallization layer or via, or another type of conductive structure of the electronic device 200. The conductive structure 306 may include a first conductive material including cobalt (Co).

An interconnect structure 308 may be included in the dielectric layer 304 and over the conductive structure 306. The interconnect structure 308 may correspond to a source or drain interconnect 238, a gate interconnect 240, a BEOL metallization layer or via, or another type of conductive structure of the electronic device 200. The interconnect structure 308 may include sidewalls 310 interfacing with the dielectric layer 304 and a bottom surface 312 interfacing with the top surface of the conductive structure 306. The interconnect structure 308 may include a layer 314 of a second conductive material including ruthenium (Ru).

The ruthenium on cobalt configuration illustrated in FIG. 3 may be included in various areas of the electronic device 200. As an example, the ruthenium interconnect structure 308 may include an M0 metallization layer and the cobalt conductive structure 306 may include a VD or a VG interconnect (e.g., a source or drain interconnect 238 or a gate interconnect 240). As another example, the cobalt conductive structure 306 may include an M0 metallization layer (e.g., a conductive structure 244 or 246) and the ruthenium interconnect structure 308 may include a V0 interconnect (or a liner of a V0 interconnect) (e.g., a via 248 or 250).

The cobalt of the conductive structure 306 and the ruthenium of the interconnect structure 308 may enable the formation of advanced interconnect structures, such as those having an aspect ratio (e.g., between a height and a width) in a range of approximately 2:1 to approximately 4:1), by providing low contact resistance (e.g., approximately 6.5 100 micro Ohm centimeters (μΩ·cm) for cobalt and approximately 7.5μΩ·cm for ruthenium) relative to tungsten (W) and other conductive materials. Moreover, cobalt has a larger grain size and improved deposition performance relative to tungsten and other conductive materials, which may result in fewer impurities and may enable thinner barrier layers. However, cobalt readily intermixes into ruthenium, particularly along the interface and grain boundaries between cobalt and ruthenium.

To reduce, minimize, and/or prevent cobalt to ruthenium intermixing, a diffusion barrier layer 316 may be included over and/or on the bottom surface 312 of the interconnect structure 308 between the interconnect structure 308 and the conductive structure 306. The diffusion barrier layer 316 may be configured to reduce, minimize, and/or prevent the cobalt of the conductive structure 306 from intermixing with the ruthenium of the interconnect structure 308. The thickness of the diffusion barrier layer 316 may be in a range of approximately 0.3 nanometers to approximately 5 nanometers to provide a low contact resistance for the interconnect structure 308 and to provide sufficient cobalt intermixing blocking performance. However, other values for the thickness of the diffusion barrier layer 316 are within the scope of the present disclosure. The ratio between the thickness of the diffusion barrier layer 316 and the width of the conductive structure 306 is in a range of approximately 1:5 to approximately 1:15 to provide sufficient cobalt intermixing blocking performance and to achieve a sufficiently thin diffusion barrier layer 316. However, other values for the ratio are within the scope of the present disclosure. The diffusion barrier layer 316 may be selectively formed and may therefore be omitted from the sidewalls 310 of the interconnect structure 308. The presence of the diffusion barrier layer 316 may be observed in a transmission electron microscopy (TEM) image and/or in a secondary ion mass spectrometry (SIMS) elemental mapping as an increased nitrogen concentration at the interface between the cobalt of the conductive structure 306 and the ruthenium of the interconnect structure 308.

The diffusion barrier layer 316 may include a metal nitride of the first conductive material included in the conductive structure 306. In particular, the diffusion barrier layer 316 may include a cobalt nitride ($CoN_x$). Cobalt nitride may have a bond dissociation energy greater than the bond dissociation energy of cobalt to cobalt (Co—Co), and may therefore function as a strong barrier to cobalt migration and diffusion into the ruthenium of the interconnect structure 308. As an example, cobalt nitride may have a bond dissociation energy of greater than approximately 450 kilojoules per mole (KJ/mol), whereas the bond dissociation energy of cobalt to cobalt may be approximately 167 KJ/mol. The strong bond dissociation energy of cobalt nitride may also enable the diffusion barrier layer 316 to withstand subsequent annealing operations (and other semiconductor processing operations). Moreover, cobalt nitride may provide low resistivity of approximately 100 μΩ·cm relative to other materials such as titanium nitride (TiN) (having a resistivity of approximately 275 μΩ·cm), tungsten nitride (WN) (having a resistivity of approximately 270 μΩ·cm), and tantalum nitride (TaN) (having a resistivity of approximately 200μΩ·cm).

As indicated above, FIG. 3 is provided as an example. Other examples may differ from what is described with regard to FIG. 3.

Figure 4A:
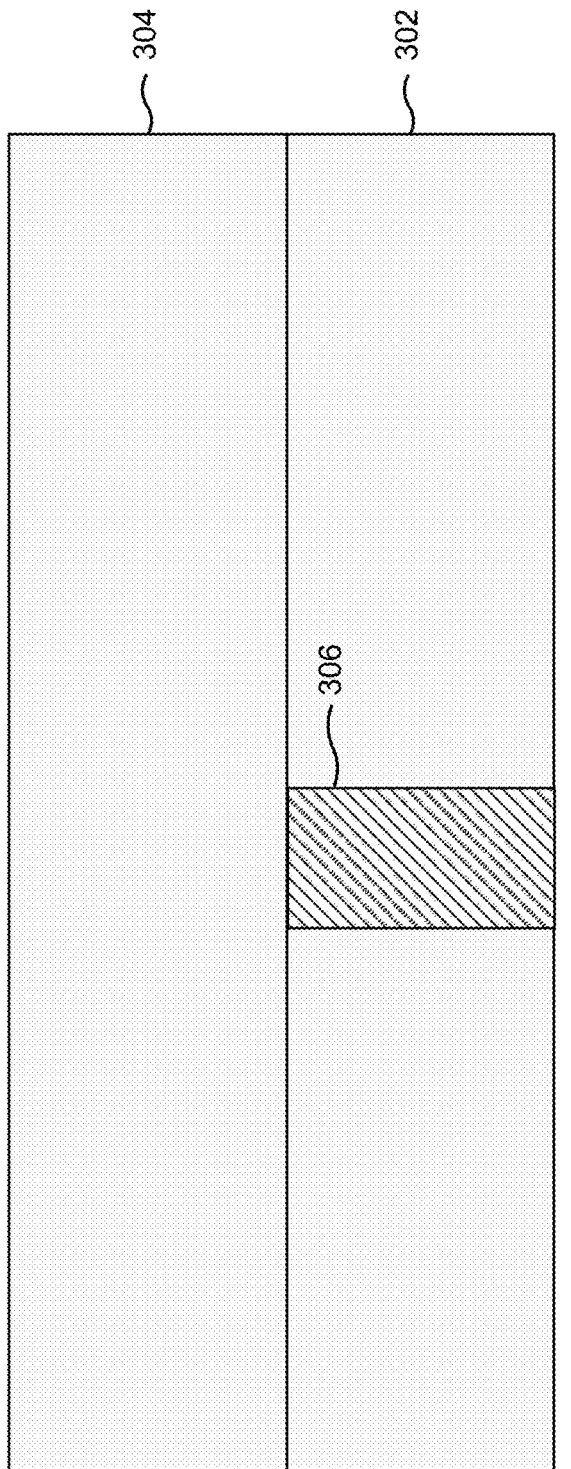
FIGS. 4A-4E are diagrams of an example implementation described herein.

FIGS. 4A-4E are diagrams of an example implementation 400 described herein. The example implementation 400 may be an example of forming the interconnect structure 308 of the example portion 300 of the electronic device 200. In some implementations, one or more of the semiconductor processing tools 102-112 perform one or more of the processes and/or operations described in connection with FIGS. 4A-4E. Turning to FIG. 4A, the interconnect structure 308 may be formed in the dielectric layer 304 above the conductive structure 306, which is included in the dielectric layer 302. The conductive structure 306 may be formed by various semiconductor processing techniques, such as lithography patterning, etching, deposition, electroplating, and/or other semiconductor processing techniques.

Figure 4B:
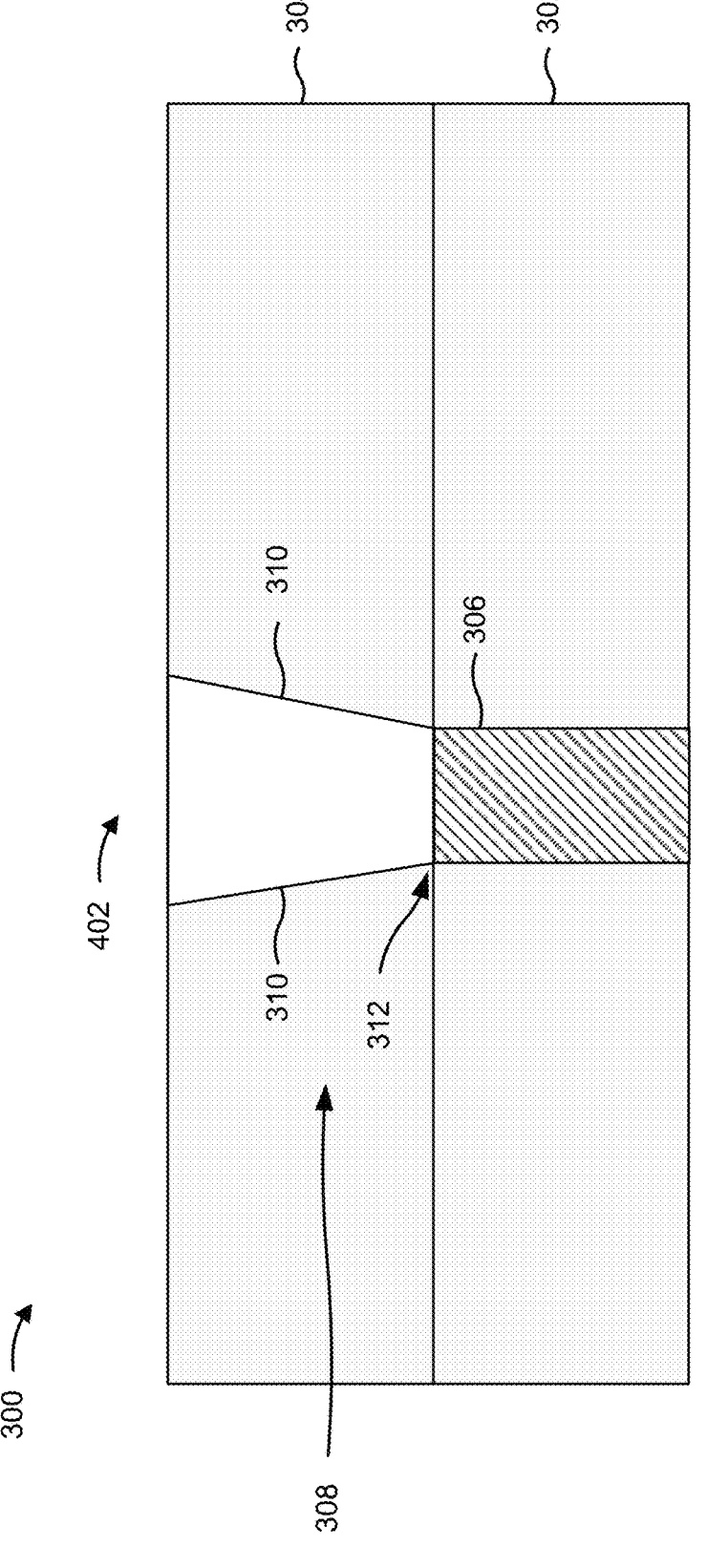

As shown in FIG. 4B, an opening 402 may be formed in and through the dielectric layer 304 to form the interconnect structure 308. The opening 402 may include a recess, a trench, a via, a hole, or another type of opening through the dielectric layer 304. The opening 402 may be formed from a top surface of the dielectric layer 304 through the dielectric layer 304, and to the top surface of the conductive structure 306. The opening 402 may include sidewalls and a bottom surface corresponding to the sidewalls 310 of the interconnect structure 308 and the bottom surface 312 of the interconnect structure 308, respectively.

To form the opening 402, the deposition tool 102 may form a photoresist layer on the dielectric layer 304. The exposure tool 104 may expose the photoresist layer to a radiation source to pattern the photoresist layer. The developer tool 106 may develop and remove portions of the photoresist layer to expose the pattern. The etch tool 108 may etch the dielectric layer 304 to form the opening 402. In some implementations, a photoresist removal tool removes the remaining portions of the photoresist layer (e.g., using a chemical stripper, plasma ashing, and/or another technique).

Figure 4C:
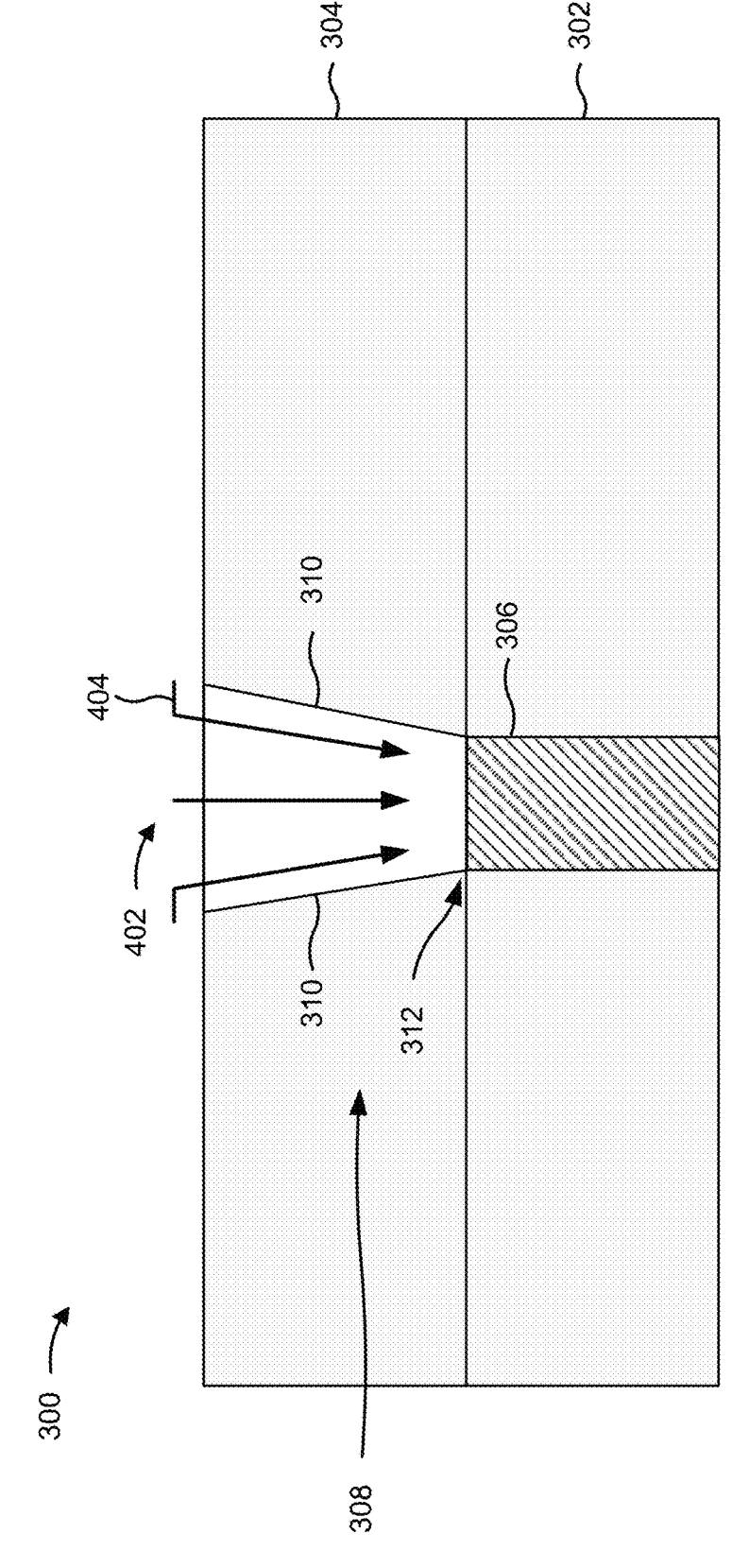

As shown in FIG. 4C, a surface treatment operation may be performed on the bottom surface 312 to form the diffusion barrier layer 316 on the bottom surface 312. The surface treatment operation may include treating the bottom surface 312 with hydrazine ($N_2H_4$). The deposition tool 102 may perform the surface treatment operation for a time duration in a range of approximately 10 seconds to approximately 4 minutes to form the diffusion barrier layer 316 to a particular thickness or to a thickness in a particular range, such as approximately 0.3 nanometers to approximately 5 nanometers. However, other values for the time duration are within the scope of the present disclosure.

The deposition tool 102 may perform a thermal ALD operation in which the electronic device 200 is placed in a processing chamber, and a flow-in of a gas mixture 404 is provided to the processing chamber while the temperature in the processing chamber is elevated. The gas mixture includes the hydrazine and a carrier gas that is used to introduce the hydrazine into the opening 402. The processing chamber may be elevated to a temperature in a range of approximately 100 degrees Celsius (e.g., to facilitate a reaction between the hydrazine and the cobalt in the conductive structure 306) to approximately 400 degrees Celsius (e.g., to minimize and/or prevent thermal damage to the semiconductor devices of the electronic device 200). However, other values for the temperature are within the scope of the present disclosure.

The carrier gas includes an inert gas such as argon (Ar) or another inert gas. A ratio between the carrier gas and the hydrazine in the gas mixture 404 may be in a range of approximately 10:1 to approximately 100:1 to achieve a deposition rate for forming the diffusion barrier layer 316 to a particular thickness or to a thickness in a particular range, such as approximately 0.3 nanometers to approximately 5 nanometers. However, other values for the ratio are within the scope of the present disclosure.

Figure 4D:
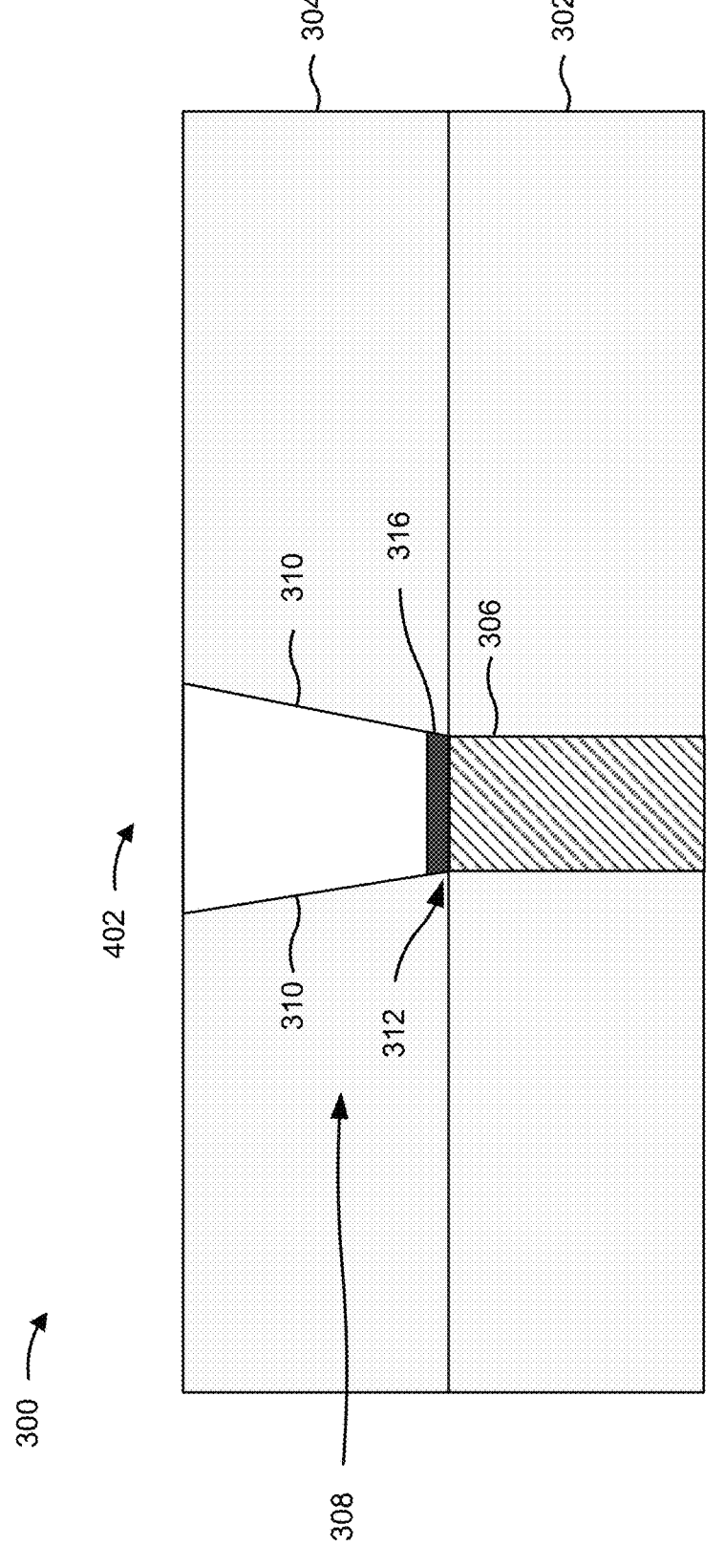

As shown in FIG. 4D, the surface treatment operation may result in the formation of the diffusion barrier layer 316. In particular, the hydrazine may react with the cobalt of the conductive structure 306 to form the diffusion barrier layer 316 on the bottom surface 312. The reaction may be selective in that the hydrazine does not react with the oxide material of the dielectric layer 304. Accordingly, the diffusion barrier layer 316 may be omitted from the sidewalls 310.

The reaction may result in the nitrogen of the hydrazine diffusing into the cobalt of the conductive structure 306, which results in the formation of cobalt nitride ($CoN_x$). The hydrazine surface treatment may be self-limiting in that the depth of the diffusion of the nitrogen of the hydrazine into the cobalt of the conductive structure 306 is limited. In this way, the hydrazine-based surface treatment operation permits the diffusion barrier layer 316 to be formed relatively thin (e.g., to approximately 0.3 nanometers to approximately 5 nanometers or another thickness). Moreover, the hydrazine-based surface treatment operation permits the diffusion barrier layer 316 to be formed without the use of a high-temperature ammonia-based operation and without the use of plasma assisted ALD, which might otherwise cause damage to the semiconductor structures of the electronic device 200. In some implementations, other nitridation techniques may be used to form the diffusion barrier layer 316, such as nitrogen treatment at high temperature or nitrogen-based N plasma treatment.

Figure 4E:
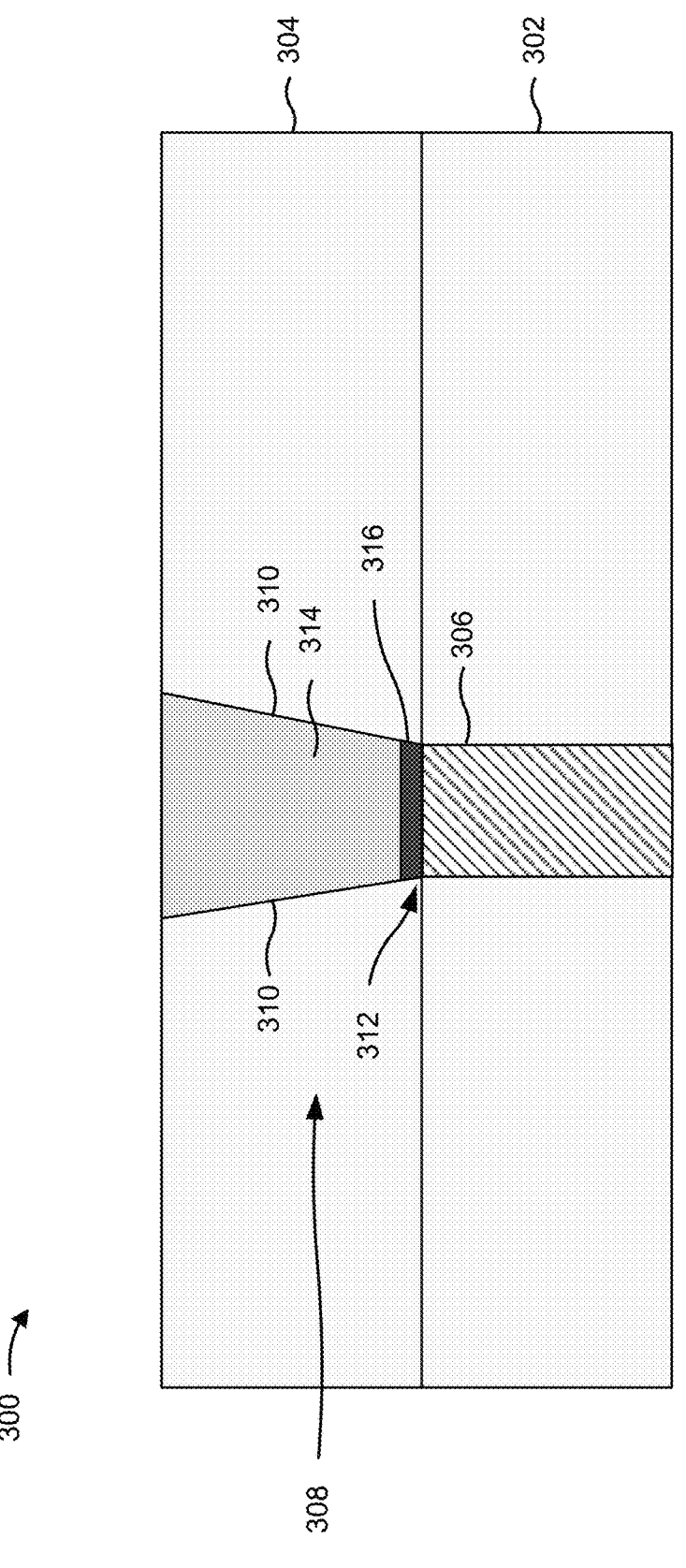

As shown in FIG. 4E, the layer 314 of the interconnect structure 308 may be formed in the remaining volume of the opening 402 over the cobalt nitride diffusion barrier layer 316. The deposition tool 102 may deposit the ruthenium of the layer 314 by a CVD operation, an ALD operation, or another type of deposition operation. The planarization tool 110 may perform a CMP operation to planarize the layer 314 after the ruthenium is deposited.

As indicated above, FIGS. 4A-4E are provided as an example. Other examples may differ from what is described with regard to FIGS. 4A-4E.

Figure 5:
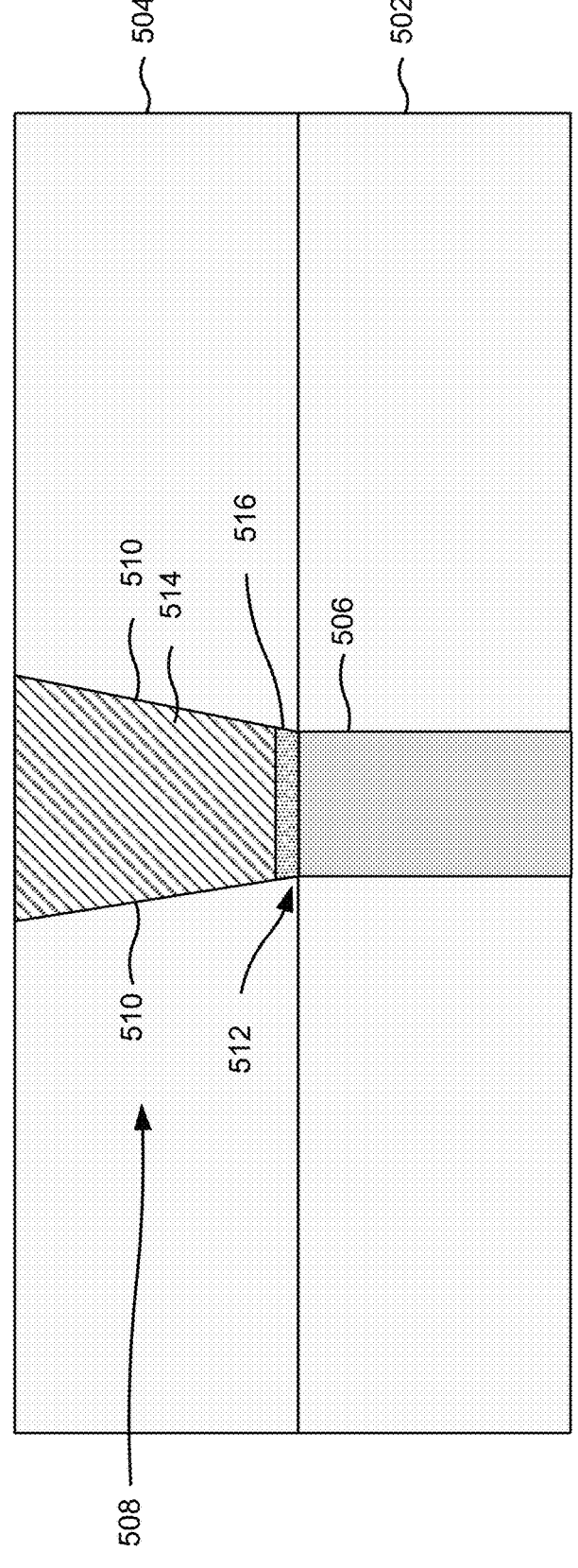
FIG. 5 is a diagram of an example portion of an electronic device described herein.

FIG. 5 is a diagram of an example portion 500 of an electronic device described herein. The example portion 500 may include a portion of the electronic device 200 and/or a portion of another type of electronic device. The example portion 500 may include elements 502-516, which may be similar to the elements 302-316 of the example portion 300 of FIG. 3. However, in the example portion 500, the conductive structure 506 includes ruthenium (Ru), the layer 514 includes cobalt (Co), and the diffusion barrier layer 516 includes a ruthenium nitride ($RuN_x$). Accordingly, the example portion 500 includes an example in which the interconnect structure 508 includes cobalt and is formed over and/or on the ruthenium conductive structure 506.

The cobalt on ruthenium configuration illustrated in FIG. 5 may be included in various areas of the electronic device 200. As an example, the cobalt interconnect structure 508 may include an M0 metallization layer (e.g., a conductive structure 244 or 246) and the ruthenium conductive structure 506 may include a VD or a VG interconnect (e.g., a source or drain interconnect 238 or a gate interconnect 240). As another example, the ruthenium conductive structure 506 may include an M0 metallization layer (e.g., a conductive structure 244 or 246) and the ruthenium interconnect structure 508 may include a V0 interconnect (or a liner of a V0 interconnect) (e.g., the via 248 or 250).

The thickness of the diffusion barrier layer 516 may be in a range of approximately 0.3 nanometers to approximately 5 nanometers to provide a low contact resistance for the interconnect structure 508 and to provide sufficient cobalt intermixing blocking performance. However, other values for the thickness of the diffusion barrier layer 516 are within the scope of the present disclosure. The ratio between the thickness of the diffusion barrier layer 516 and the width of the conductive structure 506 is in a range of approximately 1:5 to approximately 1:15 to provide sufficient cobalt intermixing blocking performance and to achieve a sufficiently thin diffusion barrier layer 516. However, other values for the ratio are within the scope of the present disclosure. The diffusion barrier layer 516 may be selectively formed and may therefore be omitted from the sidewalls 510 of the interconnect structure 508. The presence of the diffusion barrier layer 516 may be observed in a TEM image and/or in a SIMS elemental mapping as an increased nitrogen concentration at the interface between the ruthenium of the conductive structure 506 and the cobalt of the interconnect structure 508.

The ruthenium nitride has a bond dissociation energy greater than the bond dissociation energy of cobalt to cobalt (Co—Co), and may therefore function as a strong barrier to cobalt migration and diffusion into the ruthenium of the conductive structure 506. As an example, cobalt nitride has a bond dissociation energy of greater than approximately 350 KJ/mol, whereas the bond dissociation energy of cobalt to cobalt is approximately 167 KJ/mol. The strong bond dissociation energy of ruthenium nitride may also enable the diffusion barrier layer 516 to withstand subsequent annealing operations (and other semiconductor processing operations). Moreover, ruthenium nitride may provide low resistivity of approximately 80 $\mu\Omega\cdot cm$ relative to other materials such as titanium nitride (TiN), tungsten nitride (WN), and tantalum nitride (TaN).

As indicated above, FIG. 5 is provided as an example. Other examples may differ from what is described with regard to FIG. 5.

Figure 6A:
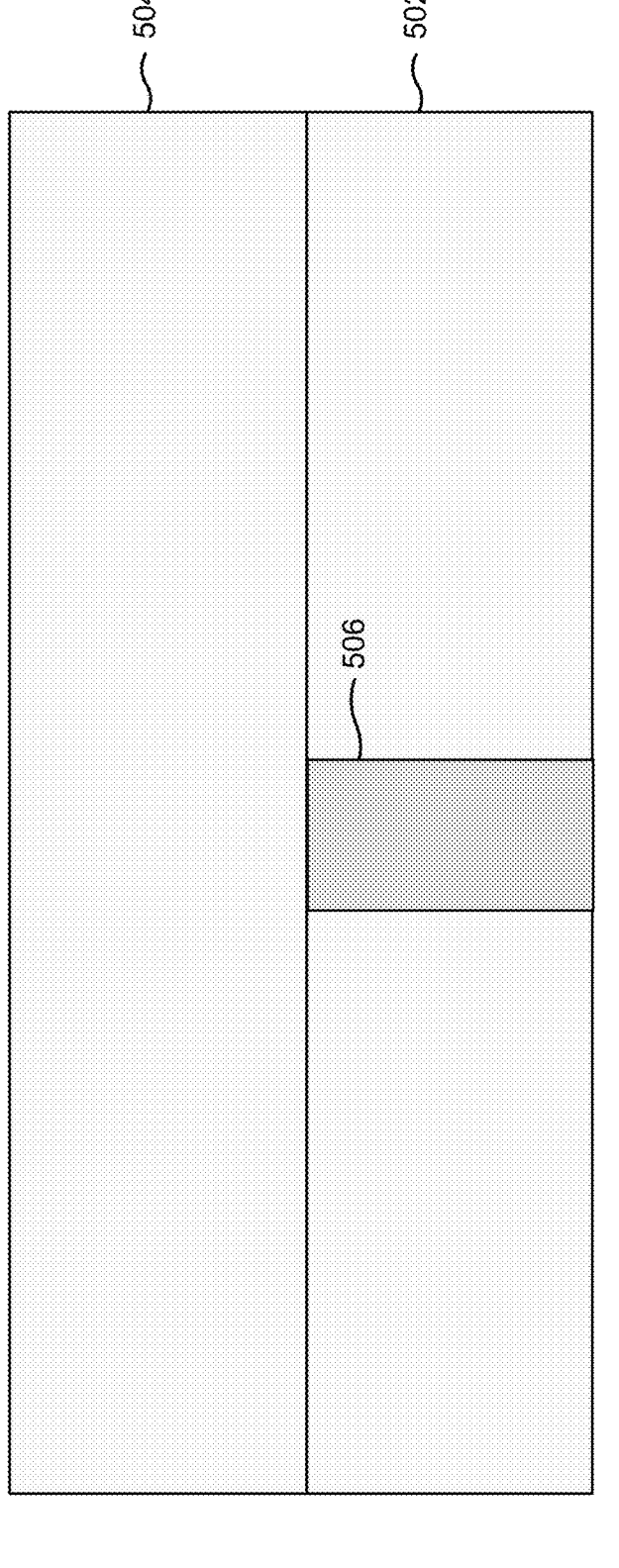
FIGS. 6A-6E are diagrams of an example implementation described herein.

FIGS. 6A-6E are diagrams of an example implementation 600 described herein. The example implementation 600 may be an example of forming the interconnect structure 508 of the example portion 500 of the electronic device 200. In some implementations, one or more of the semiconductor processing tools 102-112 perform one or more of the processes and/or operations described in connection with FIGS. 6A-6E. Turning to FIG. 6A, the interconnect structure 508 may be formed in the dielectric layer 504 above the conductive structure 506, which is included in the dielectric layer 502. The conductive structure 506 may be formed by various semiconductor processing techniques, such as lithography patterning, etching, deposition, electroplating, and/or other semiconductor processing techniques.

Figure 6B:
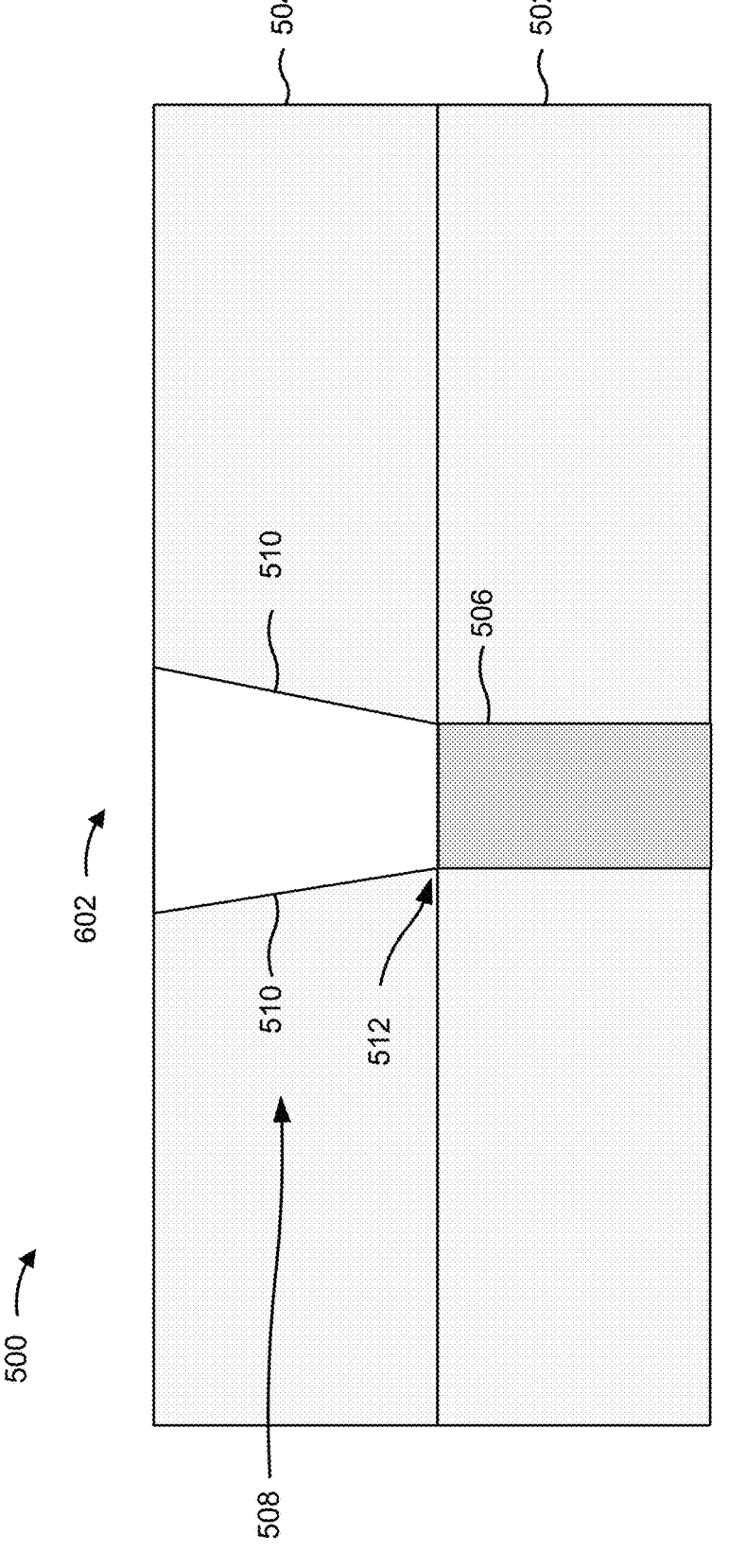

As shown in FIG. 6B, an opening 602 may be formed in and through the dielectric layer 504 to form the interconnect structure 508. The opening 602 may include a recess, a trench, a via, a hole, or another type of opening through the dielectric layer 504. The opening 602 may be formed from a top surface of the dielectric layer 504 through the dielectric layer 504, and to the top surface of the conductive structure 506. The opening 602 may include sidewalls and a bottom surface corresponding to the sidewalls 510 of the interconnect structure 508 and the bottom surface 512 of the interconnect structure 508, respectively. The opening 602 may be formed in a similar manner as the opening 402 described above in connection with FIGS. 4A-4E.

Figure 6C:
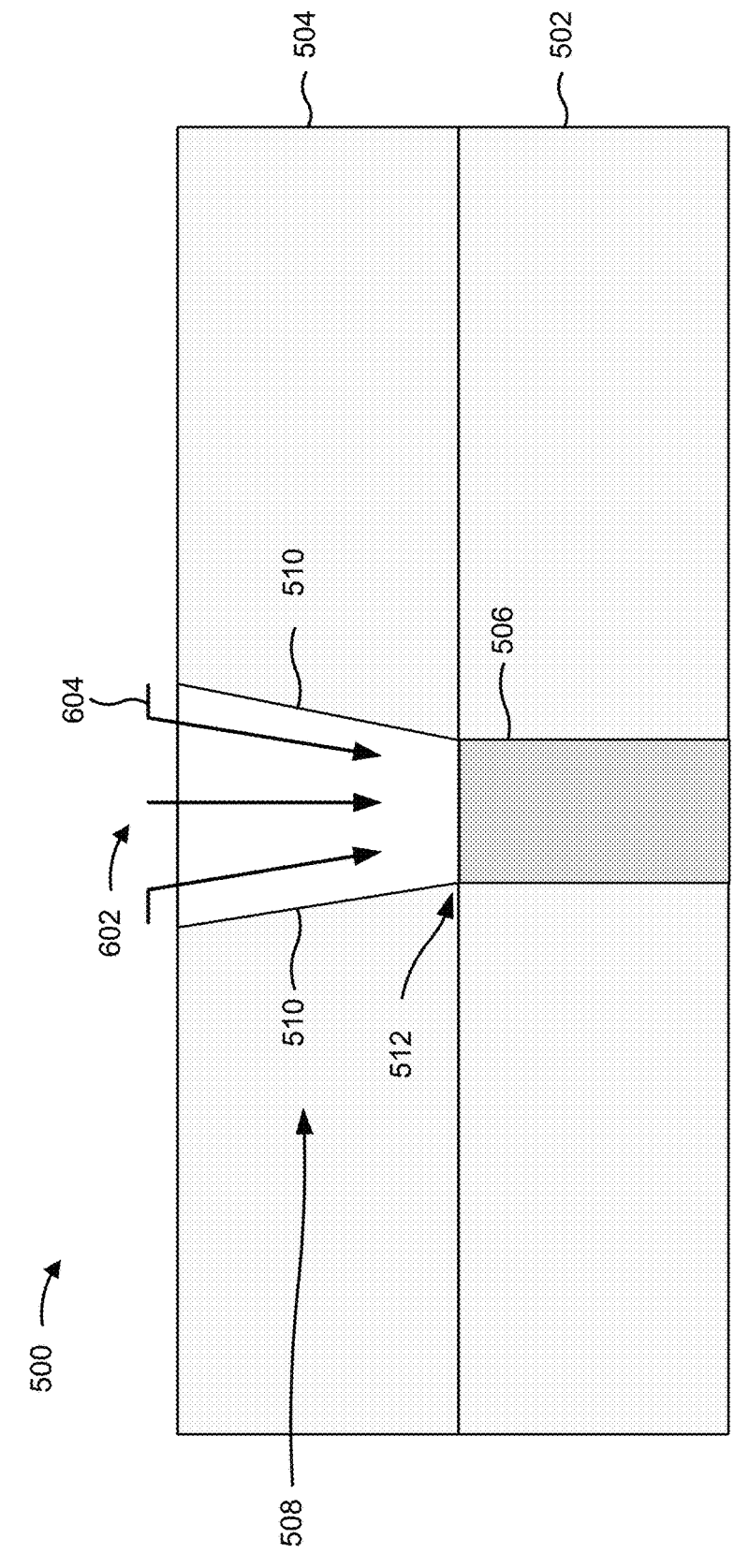

As shown in FIG. 6C, a surface treatment operation may be performed on the bottom surface 512 to form the diffusion barrier layer 516 on the bottom surface 512. The surface treatment operation may include treating the bottom surface 512 with hydrazine ($N_2H_4$). The deposition tool 102 may perform a thermal ALD operation in which the electronic device 200 is placed in a processing chamber, and a flow-in of a gas mixture 604 is provided to the processing chamber while the temperature in the processing chamber is elevated. The gas mixture includes the hydrazine and a carrier gas that is used to introduce the hydrazine into the opening 602 in a manner similar as described above in connection with FIGS. 4A-4E.

Figure 6D:
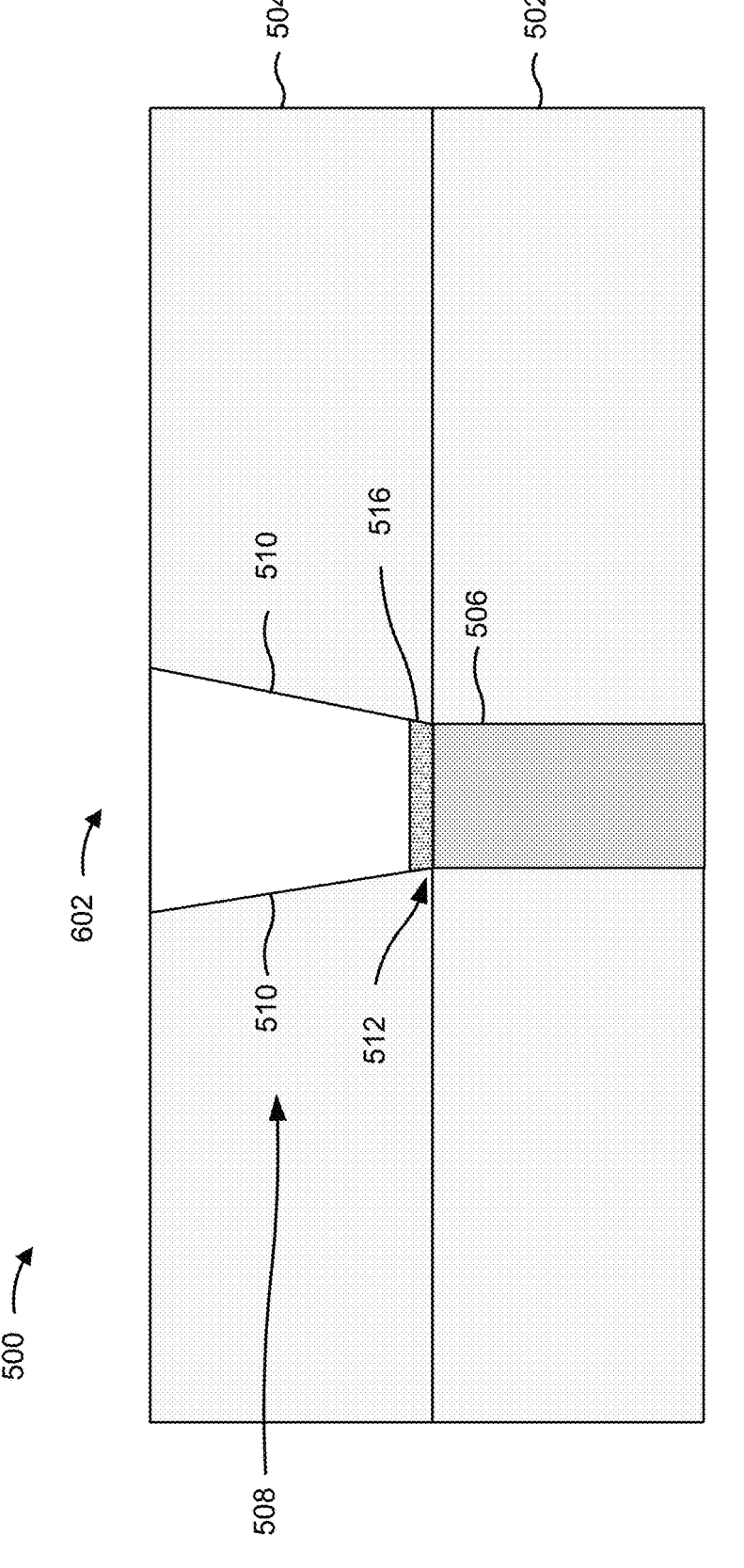

As shown in FIG. 6D, the surface treatment operation may result in the formation of the diffusion barrier layer 516. In particular, the hydrazine may react with the ruthenium of the conductive structure 506 to form the diffusion barrier layer 516 over and/or on the bottom surface 512. The reaction may be selective in that the hydrazine does not react with the oxide material of the dielectric layer 504. Accordingly, the diffusion barrier layer 516 may be omitted from the sidewalls 510. The reaction may result in the nitrogen of the hydrazine diffusing into the ruthenium of the conductive structure 506, which results in the formation of ruthenium nitride ($RuN_x$). The hydrazine surface treatment may be self-limiting in that the depth of the diffusion of the nitrogen of the hydrazine into the ruthenium of the conductive structure 506 is limited. In this way, the hydrazine-based surface treatment operation permits the diffusion barrier layer 516 to be formed relatively thin (e.g., to approximately 0.5 nanometers to approximately 2 nanometers or another thickness). Moreover, the hydrazine-based surface treatment operation permits the diffusion barrier layer 516 to be formed without the use of a high-temperature ammonia-based operation and without the use of plasma assisted ALD, which might otherwise cause damage to the semiconductor structures of the electronic device 200. In some implementations, other nitridation techniques may be used to form the diffusion barrier layer 516, such as nitrogen treatment at high temperature or nitrogen-based N plasma treatment.

Figure 6E:
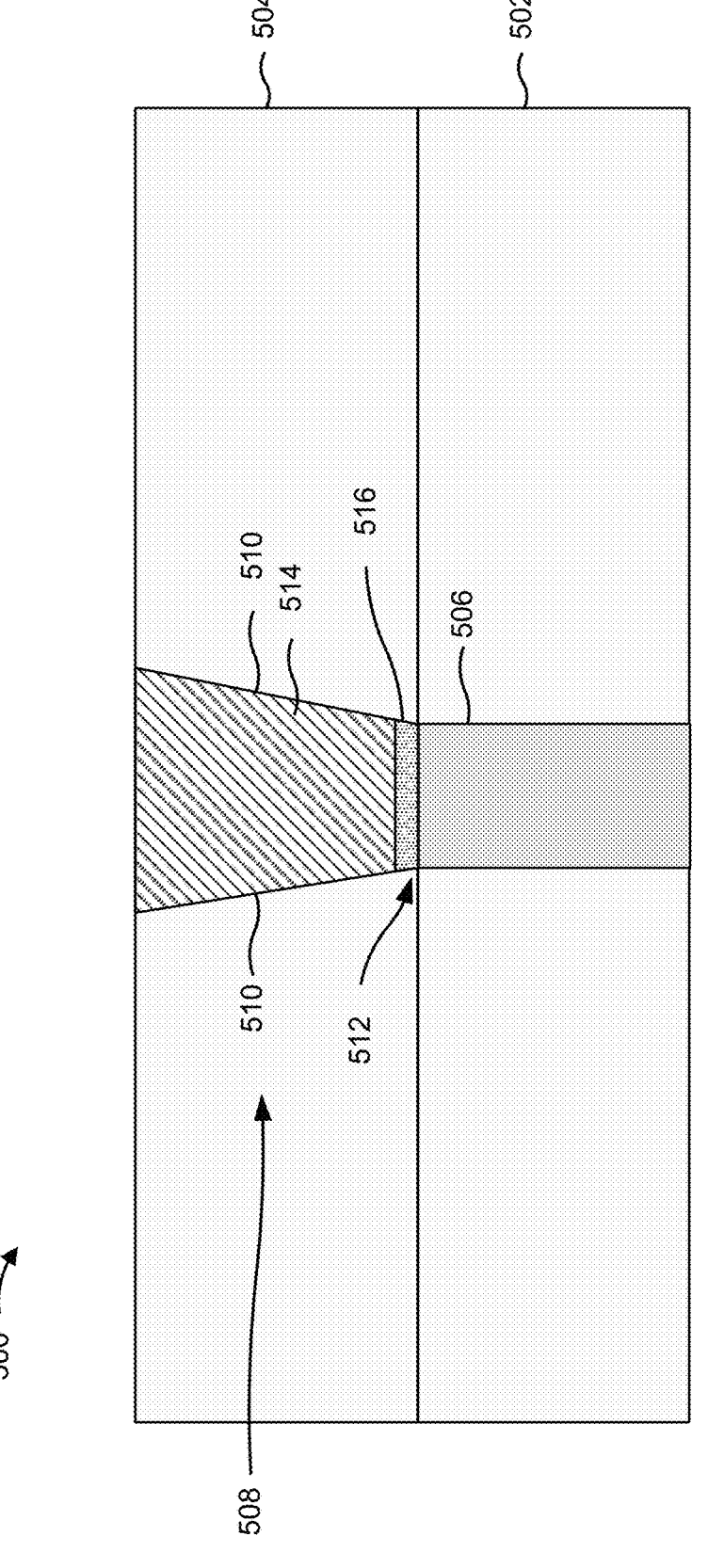

As shown in FIG. 6E, the layer 514 of the interconnect structure 508 may be formed in the remaining volume of the opening 602 over the ruthenium nitride diffusion barrier layer 516. The deposition tool 102 may deposit the cobalt of the layer 514 by a CVD operation, an ALD operation, or another type of deposition operation. The planarization tool 110 may perform a CMP operation to planarize the layer 514 after the cobalt is deposited.

As indicated above, FIGS. 6A-6E are provided as an example. Other examples may differ from what is described with regard to FIGS. 6A-6E.

Figure 7:
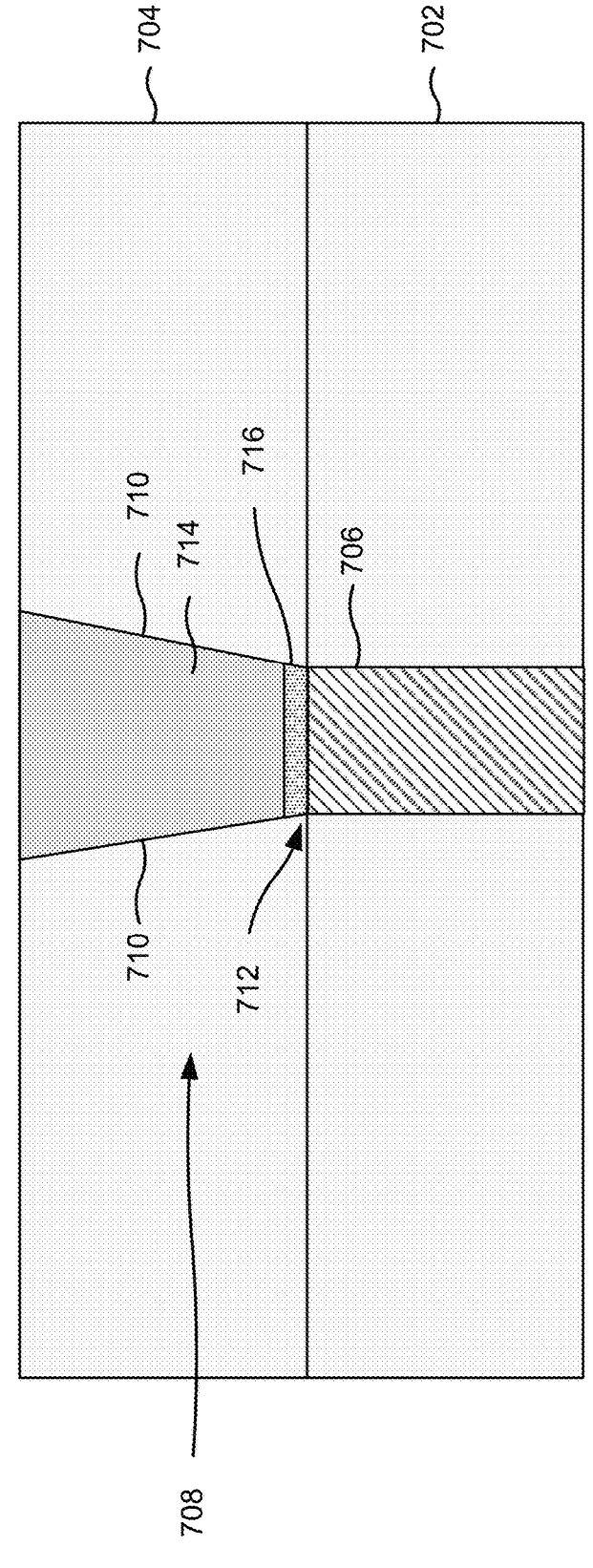
FIG. 7 is a diagram of an example portion of an electronic device described herein.

FIG. 7 is a diagram of an example portion 700 of an electronic device described herein. The example portion 700 may include a portion of the electronic device 200 and/or a portion of another type of electronic device. The example portion 700 may include elements 702-716, which may be similar to the elements 302-316 of the example portion 300 of FIG. 3. However, in the example portion 700, the conductive structure 706 includes cobalt (Co), the layer 714 includes ruthenium (Ru), and the diffusion barrier layer 716 includes a ruthenium nitride ($RuN_x$). Accordingly, the example portion 700 includes an example in which a ruthenium nitride diffusion barrier layer is formed over and/or on the cobalt conductive structure 706. The ruthenium nitride diffusion barrier layer 716 may be similar to the ruthenium nitride diffusion barrier layer 516 described above in connection with FIG. 5.

The ruthenium on cobalt configuration illustrated in FIG. 7 may be included in various areas of the electronic device 200. As an example, the ruthenium interconnect structure 708 may include an M0 metallization layer (e.g., the conductive structure 244 or 246) and the cobalt conductive structure 706 may include a VD or a VG interconnect (e.g., a source or drain interconnect 238 or a gate interconnect 240). As another example, the cobalt conductive structure 706 may include an M0 metallization layer (e.g., the conductive structure 244 or 246) and the ruthenium interconnect structure 708 may include a V0 interconnect (or a liner of a V0 interconnect) (e.g., the via 248 or 250).

As indicated above, FIG. 7 is provided as an example. Other examples may differ from what is described with regard to FIG. 7.

Figure 8A:
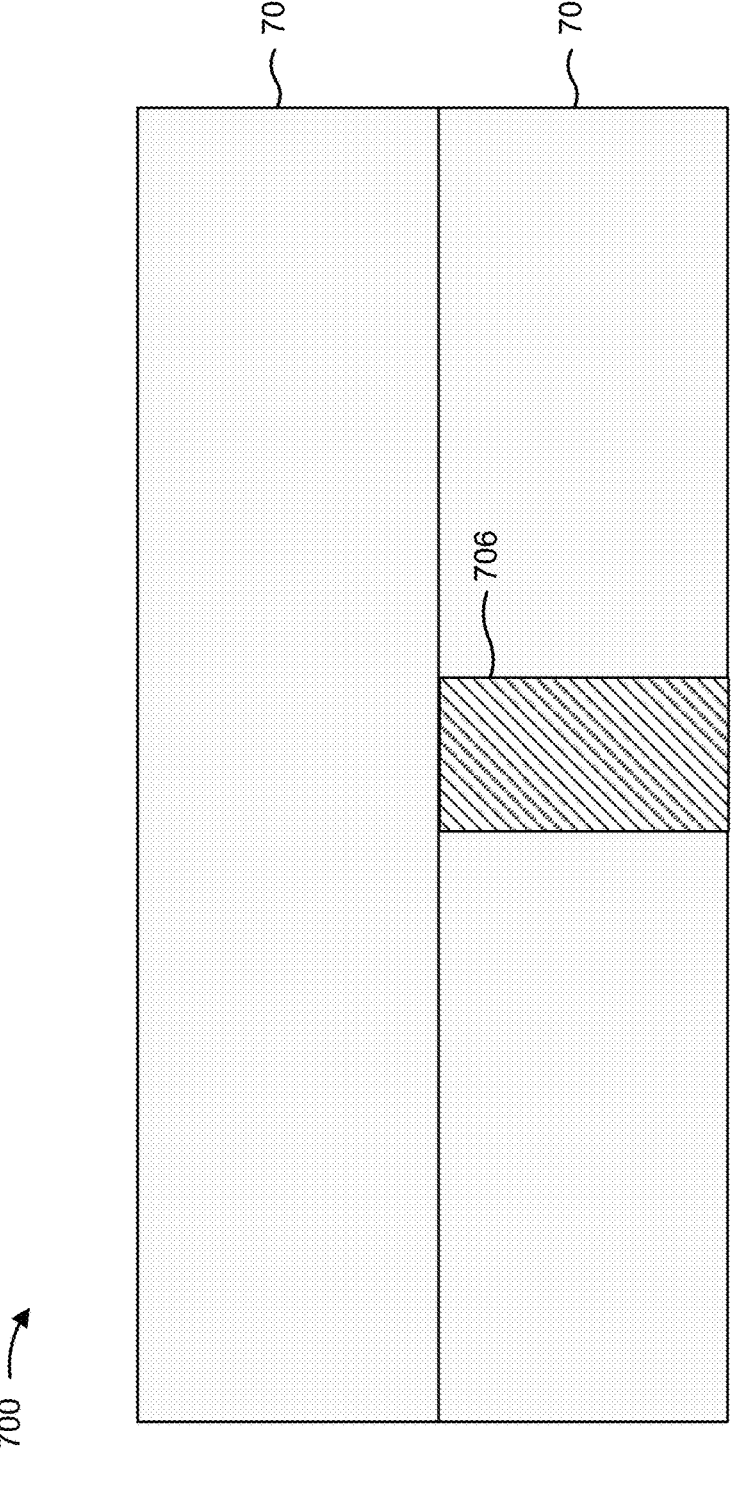
FIGS. 8A-8E are diagrams of an example implementation described herein.

FIGS. 8A-8E are diagrams of an example implementation 800 described herein. The example implementation 800 may be an example of forming the interconnect structure 708 of the example portion 700 of the electronic device 200. In some implementations, one or more of the semiconductor processing tools 102-112 perform one or more of the processes and/or operations described in connection with FIGS. 8A-8E. Turning to FIG. 8A, the interconnect structure 708 may be formed in the dielectric layer 704 above the conductive structure 706, which is included in the dielectric layer 702. The conductive structure 706 may be formed by various semiconductor processing techniques, such as lithography patterning, etching, deposition, electroplating, and/or other semiconductor processing techniques.

Figure 8B:
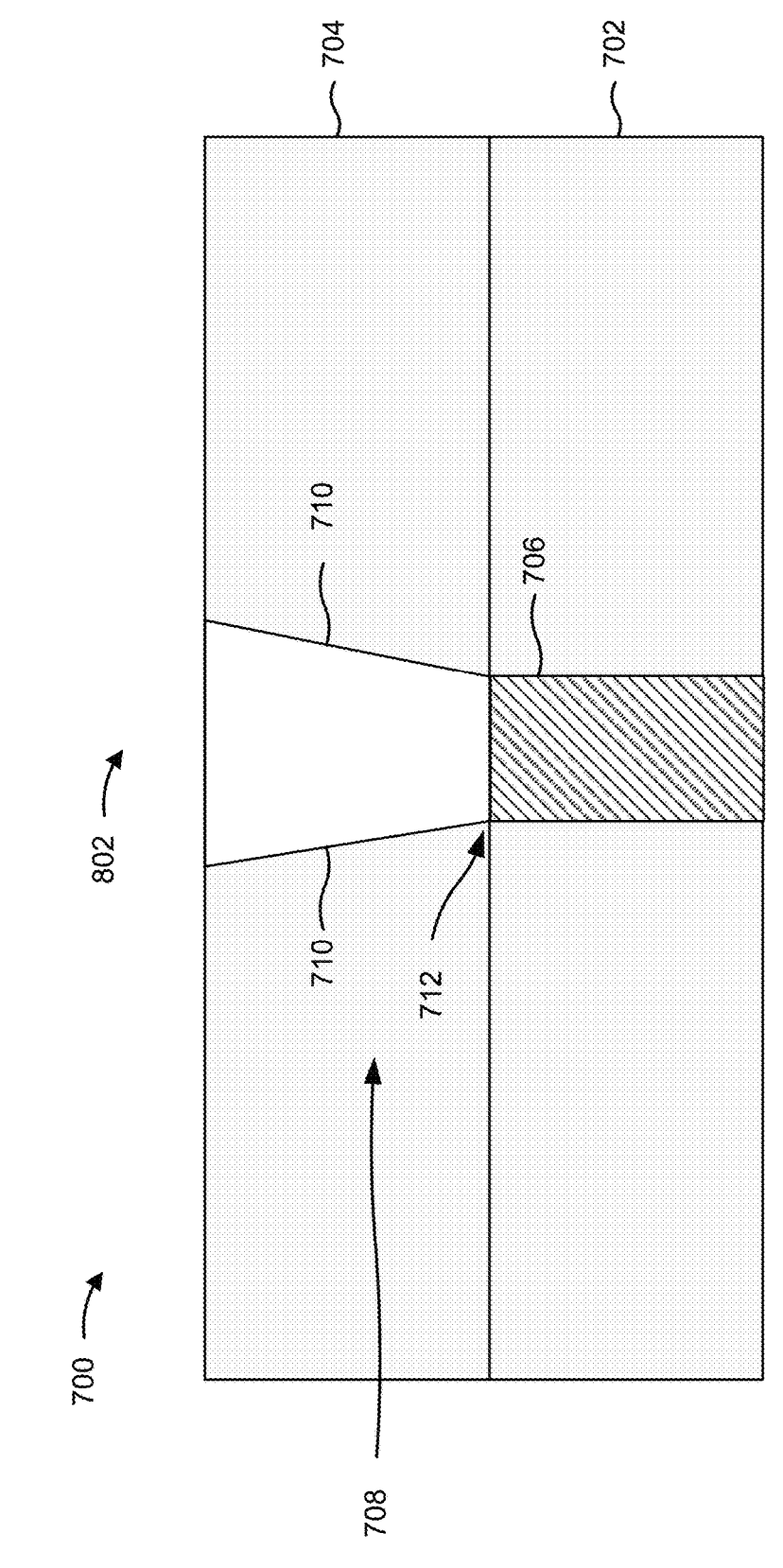

As shown in FIG. 8B, an opening 802 may be formed in and through the dielectric layer 704 to form the interconnect structure 708. The opening 802 may include a recess, a trench, a via, a hole, or another type of opening through the dielectric layer 704. The opening 802 may be formed from a top surface of the dielectric layer 704 through the dielectric layer 704, and to the top surface of the conductive structure 706. The opening 802 may include sidewalls and a bottom surface corresponding to the sidewalls 710 of the interconnect structure 708 and the bottom surface 712 of the interconnect structure 708, respectively. The opening 802 may be formed in a similar manner as the opening 402 described above in connection with FIGS. 4A-4E.

Figure 8C:
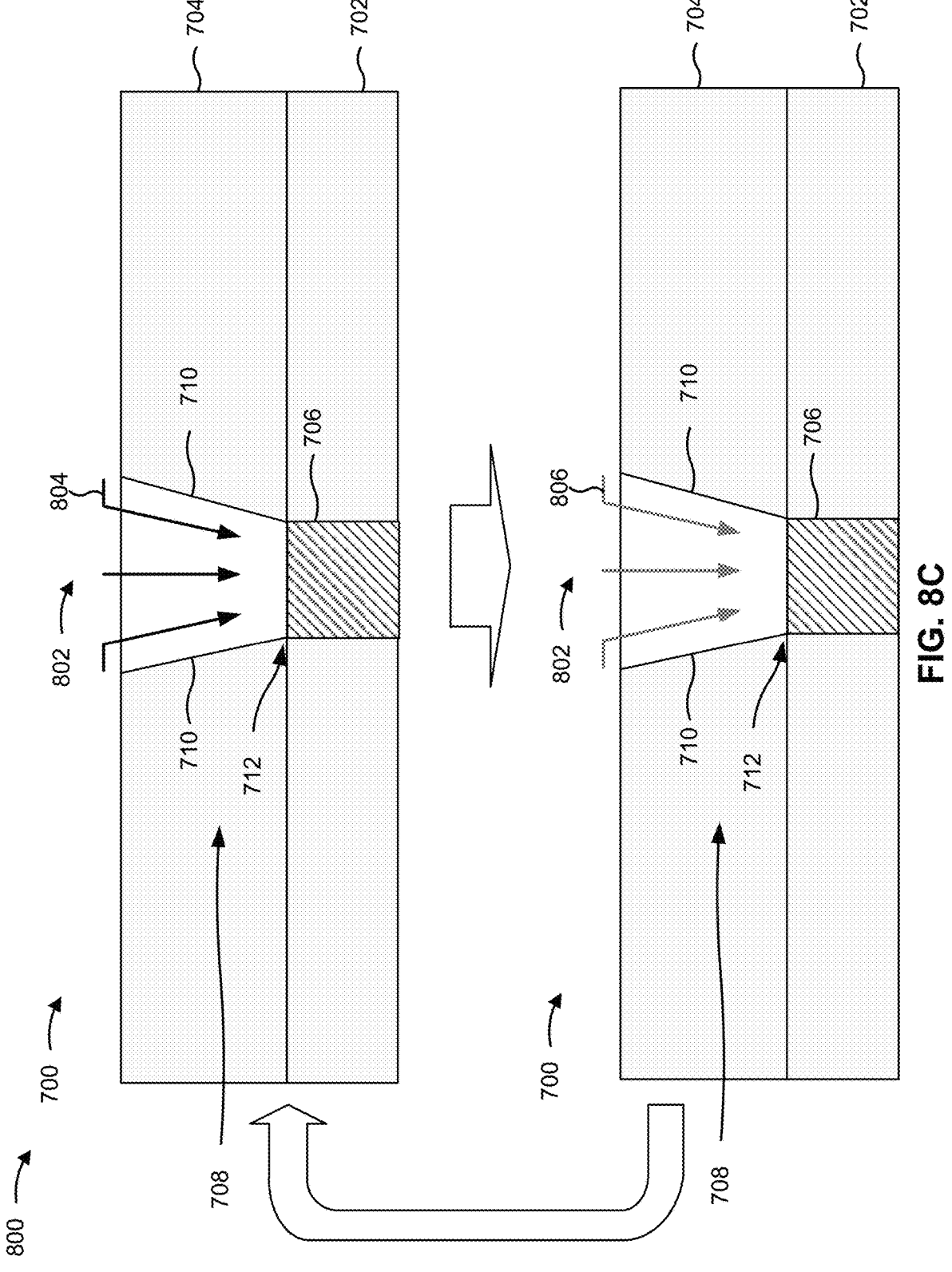

As shown in FIG. 8C, one or more processing cycles may be performed to form the diffusion barrier layer 716 over and/or on the bottom surface 712. Each processing cycle may include a combination of a surface treatment operation using a hydrazine ($N_2H_4$) and a deposition operation of a ruthenium precursor. The plurality of processing cycles may be performed sequentially to incrementally grow or increase the thickness of the diffusion barrier layer 716 to a final thickness of the diffusion barrier layer 716. For example, a first processing cycle may be performed to perform a first surface treatment operation using the hydrazine and to perform a first deposition operation to deposit the ruthenium precursor, a second processing cycle may be performed to perform a second surface treatment operation using the hydrazine and to perform a second deposition operation to deposit the ruthenium precursor, and so on. In some implementations, the thickness of the diffusion barrier layer 716 is increased in a range of approximately 0.25 nanometers to approximately 1 nanometer per processing cycle. However, other values for the thickness increase per processing cycle are within the scope of the present disclosure.

The quantity of processing cycles that are to be performed may be based on process control (e.g., the amount of ruthenium nitride that is to be formed in each processing cycle), a final thickness of the diffusion barrier layer 716 that is to be achieved, a time duration of each processing cycle, flow rates of the hydrazine and the ruthenium precursor, the temperature of the processing cycles, and/or one or more other parameters. In some implementations, the quantity of processing cycles is in a range of 1 processing cycle to 20 processing cycles to provide sufficient process control over the formation of the diffusion barrier layer 716 to achieve a thickness of the diffusion barrier layer 716 in a range of approximately 0.3 nanometers to approximately 5 nanometers. However, other quantities of processing cycles are within the scope of the present disclosure.

The surface treatment operation of a processing cycle may include treating the bottom surface 712 with the hydrazine. The deposition tool 102 may perform a thermal ALD operation in which the electronic device 200 is placed in a processing chamber, and a flow-in of a gas mixture 804 that includes the hydrazine and a carrier gas is provided to the processing chamber while the temperature in the processing chamber is elevated. The hydrazine may be introduced into the opening 802 using the carrier gas, as described above in connection with FIGS. 4A-4E. The nitrogen (N) in the hydrazine may cause the bottom surface 712 to become nitrogenized and self-limited to prevent further nitrogen diffusion into the cobalt of the conductive structure 706. The gas mixture 804 is then purged from the processing chamber using a purge gas such as argon (Ar), helium (He), hydrogen ($H_2$), and/or another inert gas. In some implementations, other nitridation techniques may be used to nitrogenize the bottom surface 712, such as nitrogen treatment at high temperature or nitrogen-based N plasma treatment.

After the processing chamber is purged of the gas mixture 804, another gas mixture 806 is introduced into the processing chamber. The deposition tool 102 may provide a flow-in of the gas mixture 806 into the processing chamber. The gas mixture 806 includes a ruthenium precursor and a carrier gas such as argon (Ar) or another inert gas. The ruthenium precursor in the gas mixture 806 is deposited onto the nitrogenized bottom surface 712. The ruthenium precursor may include $\eta^4$-2,3-dimethylbutadiene ruthenium tricarbonyl ($Ru(DMBD)(CO)_3$) and/or another ruthenium precursor that may be used to deposit ruthenium on the bottom surface 712. A ratio between the carrier gas and the ruthenium precursor may be in a range of approximately 10:1 to approximately 200:1 to achieve a deposition rate for forming the diffusion barrier layer 716 to a particular thickness or to a thickness in a particular range, such as approximately 0.3 nanometers to approximately 5 nanometers. However, other values for the ratio are within the scope of the present disclosure. The gas mixture 806 is then purged from the processing chamber using a purge gas such as argon (Ar), helium (He), hydrogen ($H_2$), and/or another inert gas.

Figure 8D:
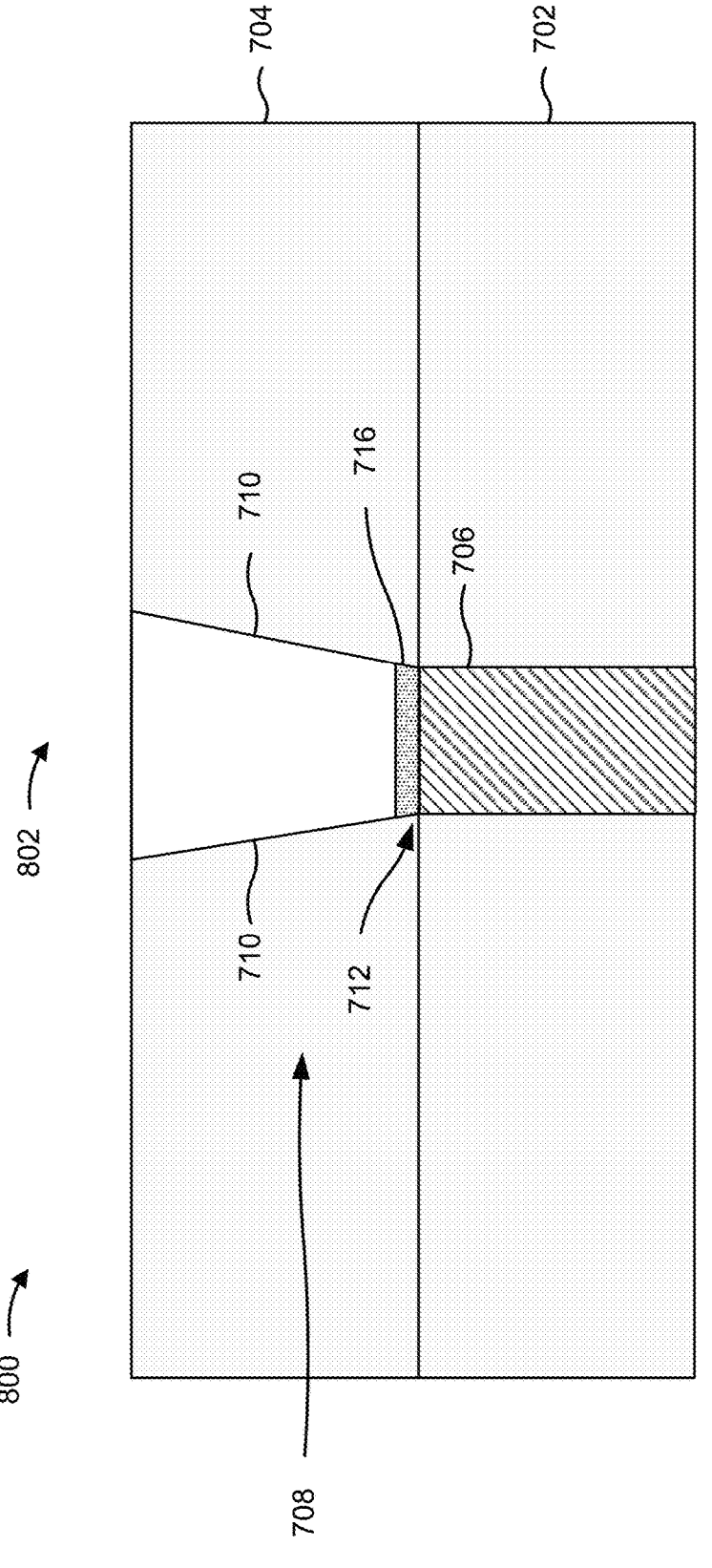

As shown in FIG. 8D, the surface treatment operation may result in the formation of the diffusion barrier layer 716. In particular, the ruthenium precursor may react with the nitrogenized bottom surface 712 through the one or more processing cycles to build or grow the ruthenium nitride diffusion barrier layer 716 over and/or on the cobalt of the bottom surface 712. The reaction may be selective in that the hydrazine does not react with the oxide material of the dielectric layer 704. Accordingly, the diffusion barrier layer 716 may be omitted from the sidewalls 710.

Figure 8E:
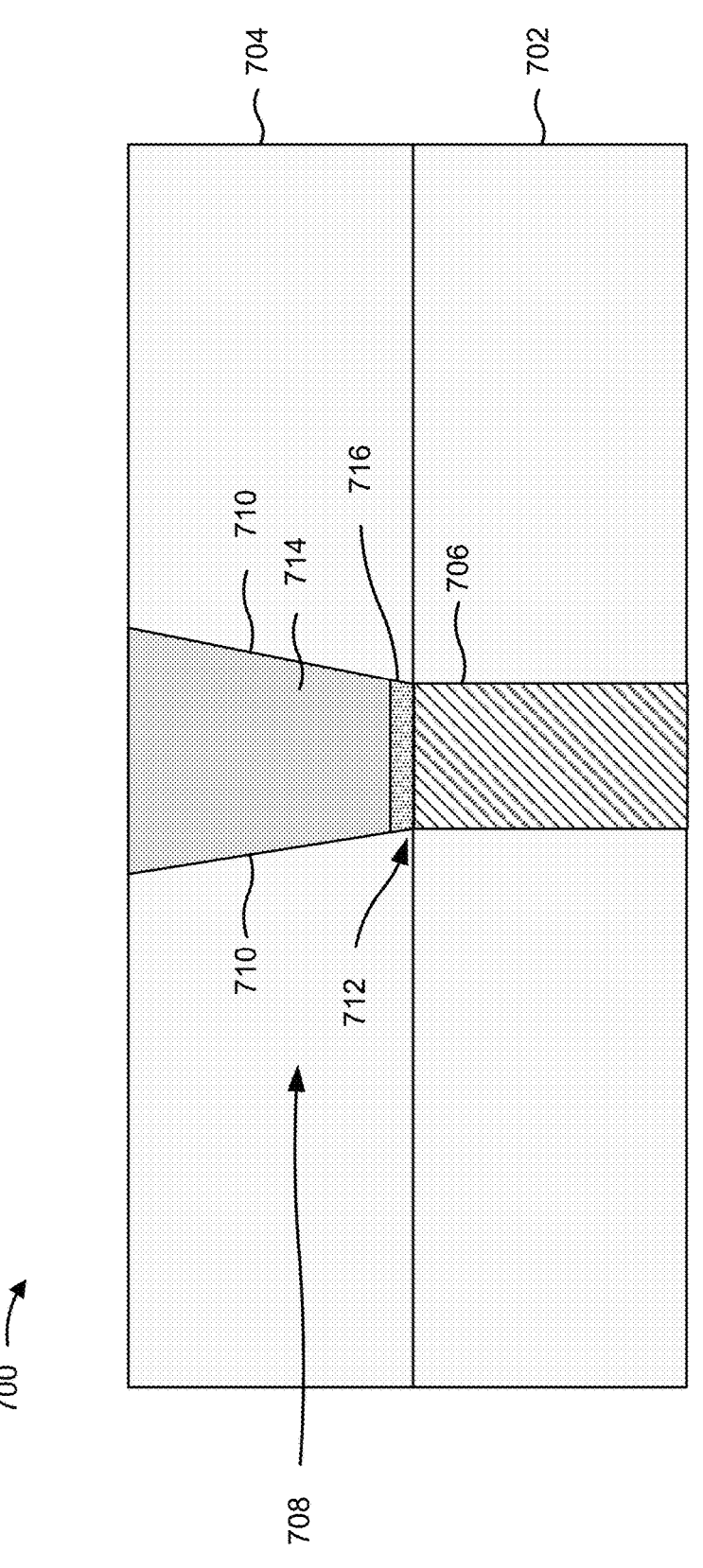

As shown in FIG. 8E, the layer 714 of the interconnect structure 708 may be formed in the remaining volume of the opening 802 over the ruthenium nitride diffusion barrier layer 716. The deposition tool 102 may deposit the cobalt of the layer 714 by a CVD operation, an ALD operation, or another type of deposition operation. The planarization tool 110 may perform a CMP operation to planarize the layer 714 after the cobalt is deposited.

As indicated above, FIGS. 8A-8E are provided as an example. Other examples may differ from what is described with regard to FIGS. 8A-8E.

Figure 9:
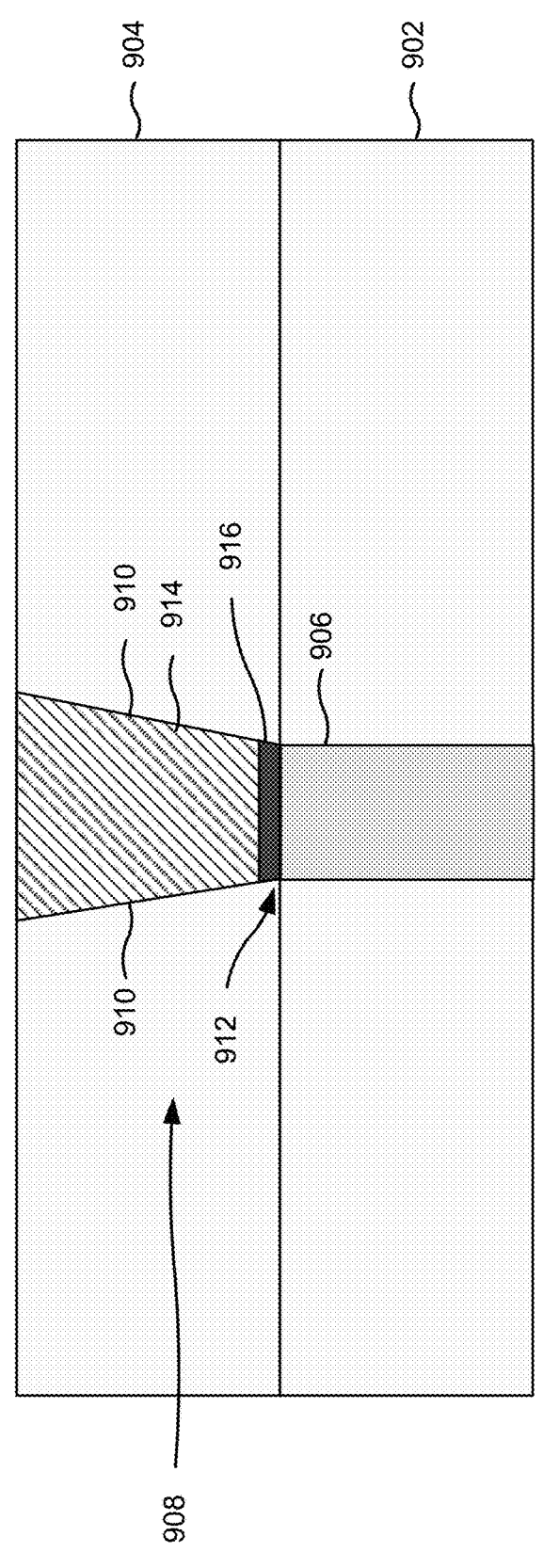
FIG. 9 is a diagram of an example portion of an electronic device described herein.

FIG. 9 is a diagram of an example portion 900 of an electronic device described herein. The example portion 900 may include a portion of the electronic device 200 and/or a portion of another type of electronic device. The example portion 900 may include elements 902-916, which may be similar to the elements 302-316 of the example portion 300 of FIG. 3. However, in the example portion 900, the conductive structure 906 includes ruthenium (Ru), the layer 914 includes cobalt (Co), and the diffusion barrier layer 916 includes a cobalt nitride ($CoN_x$). Accordingly, the example portion 900 includes an example in which a cobalt nitride diffusion barrier layer 916 is formed over and/or on the ruthenium conductive structure 906. The cobalt nitride diffusion barrier layer 916 may be similar to the cobalt nitride diffusion barrier layer 316 described above in connection with FIG. 3.

The cobalt on ruthenium configuration illustrated in FIG. 9 may be included in various areas of the electronic device 200. As an example, the cobalt interconnect structure 908 may include an M0 metallization layer (e.g., the conductive structure 244 or 250) and the ruthenium conductive structure 906 may include a VD or a VG interconnect (e.g., a source or drain interconnect 238 or a gate interconnect 240). As another example, the ruthenium conductive structure 906 may include an M0 metallization layer (e.g., the conductive structure 244 or 250) and the ruthenium interconnect structure 908 may include a V0 interconnect (or a liner of a V0 interconnect) (e.g., the via 240 or 250).

As indicated above, FIG. 9 is provided as an example. Other examples may differ from what is described with regard to FIG. 9.

Figure 10A:
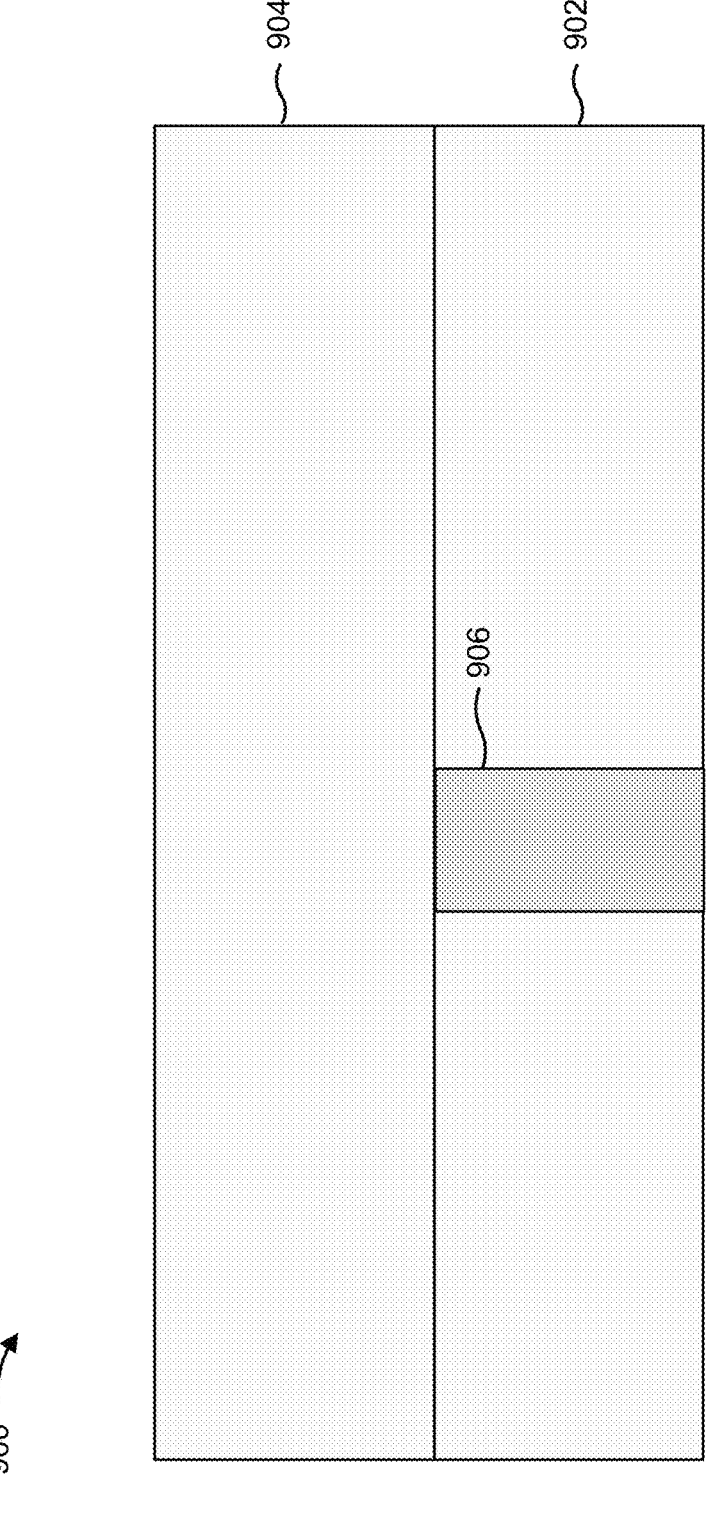
FIGS. 10A-10E are diagrams of an example implementation described herein.

FIGS. 10A-10E are diagrams of an example implementation 1000 described herein. The example implementation 1000 may be an example of forming the interconnect structure 908 of the example portion 900 of the electronic device 200. In some implementations, one or more of the semiconductor processing tools 102-112 perform one or more of the processes and/or operations described in connection with FIGS. 10A-10E. Turning to FIG. 10A, the interconnect structure 908 may be formed in the dielectric layer 904 above the conductive structure 906, which is included in the dielectric layer 904. The conductive structure 902 may be formed by various semiconductor processing techniques, such as lithography patterning, etching, deposition, electroplating, and/or other semiconductor processing techniques.

Figure 10B:
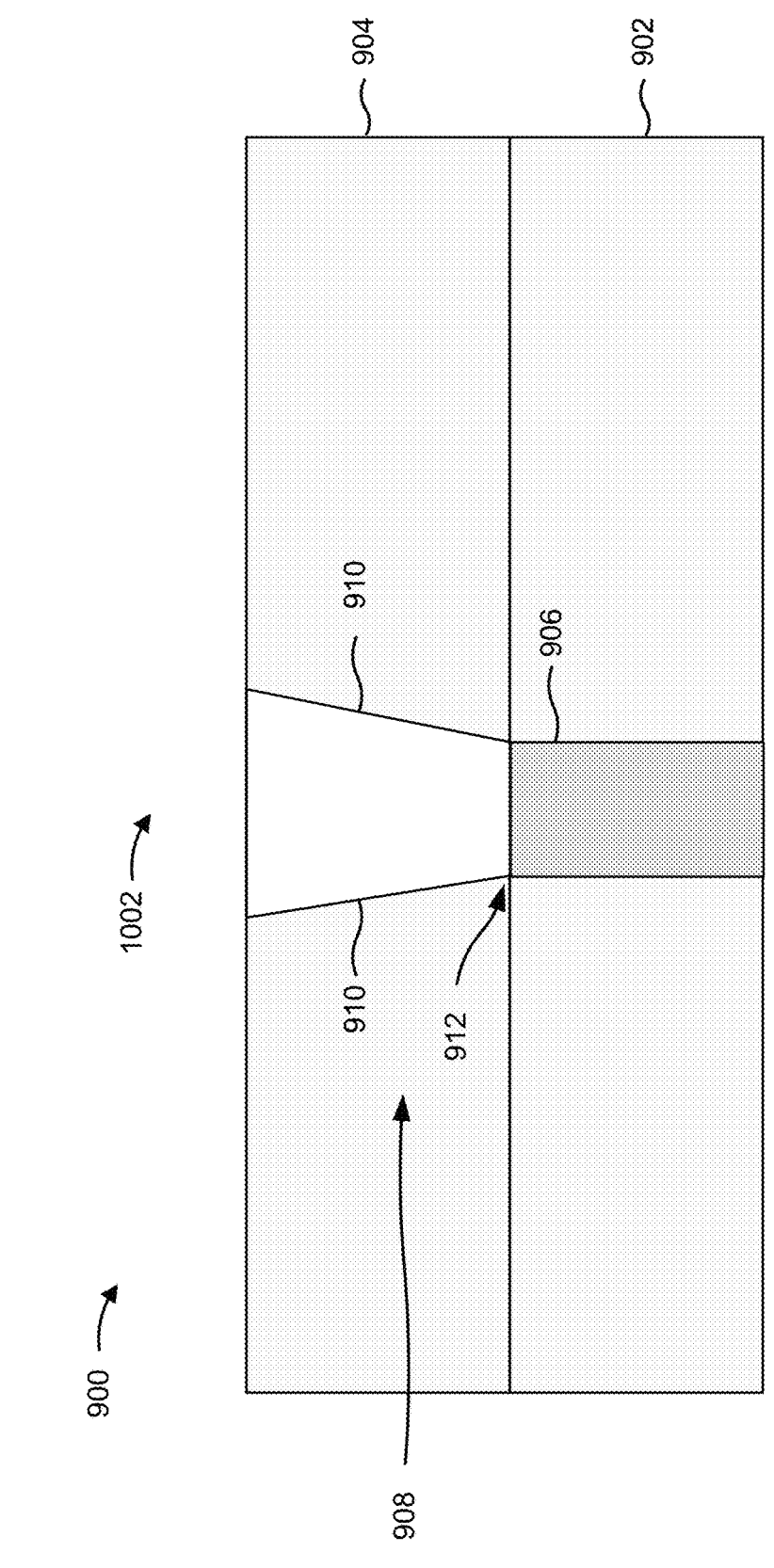

As shown in FIG. 10B, an opening 1002 may be formed in and through the dielectric layer 904 to form the interconnect structure 908. The opening 1002 may include a recess, a trench, a via, a hole, or another type of opening through the dielectric layer 904. The opening 1002 may be formed from a top surface of the dielectric layer 904 through the dielectric layer 904, and to the top surface of the conductive structure 906. The opening 1002 may include sidewalls and a bottom surface corresponding to the sidewalls 910 of the interconnect structure 908 and the bottom surface 912 of the interconnect structure 908, respectively. The opening 1002 may be formed in a similar manner as the opening 402 described above in connection with FIGS. 4A-4E.

Figure 10C:
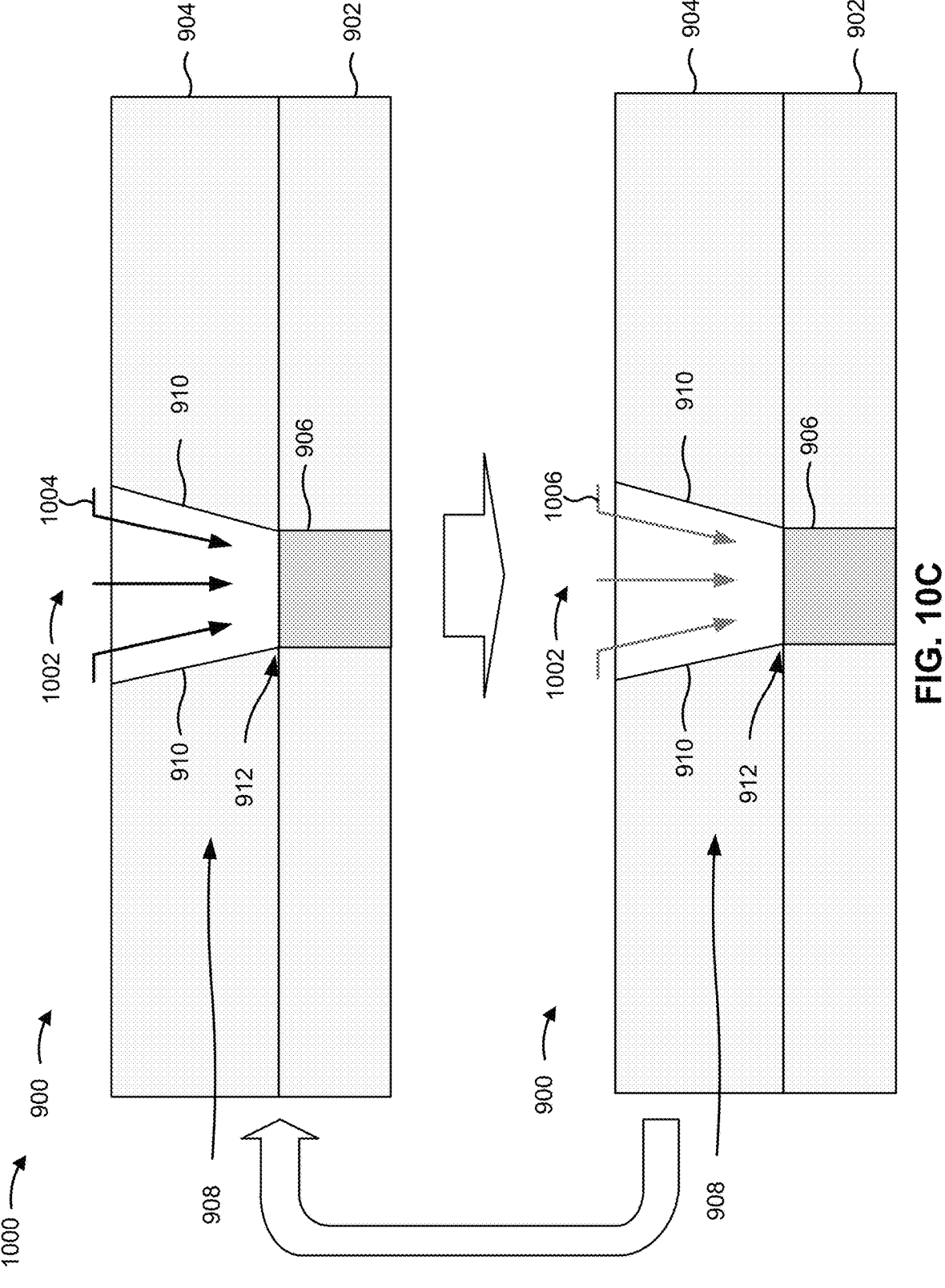

As shown in FIG. 10C, one or more processing cycles may be performed to form the diffusion barrier layer 916 over and/or on the bottom surface 912. Each processing cycle may include a combination of a surface treatment operation using a hydrazine ($N_2H_4$) and a deposition operation of a cobalt precursor. The plurality of processing cycles may be performed sequentially to incrementally grow or increase the thickness of the diffusion barrier layer 916 to a final thickness of the diffusion barrier layer 916 in a similar manner as described above in connection with FIGS. 8A-8E. The cobalt precursor may include bis(cyclopentadienyl) cobalt (II) $Co(C_5H_5)_2$ and/or another cobalt precursor that may be used to deposit cobalt on the bottom surface 912. In some implementations, other nitridation techniques may be used to nitrogenize the bottom surface 912, such as nitrogen treatment at high temperature or nitrogen-based N plasma treatment.

The surface treatment operation of a processing cycle may include treating the bottom surface 912 with the hydrazine. The deposition tool 102 may perform a thermal ALD operation in which the electronic device 200 is placed in a processing chamber, and a flow-in of a gas mixture 1004 that includes the hydrazine and a carrier gas is provided to the processing chamber while the temperature in the processing chamber is elevated. The hydrazine may be introduced into the opening 1002 using the carrier gas, as described above in connection with FIGS. 4A-4E. The nitrogen (N) in the hydrazine may cause the bottom surface 912 to become nitrogenized and self-limited to prevent further nitrogen diffusion into the ruthenium of the conductive structure 906. The gas mixture 1004 is then purged from the processing chamber using a purge gas such as argon (Ar), helium (He), hydrogen (H$_2$), and/or another inert gas. After the processing chamber is purged of the gas mixture 1004, another gas mixture 1006 is introduced into the processing chamber. The deposition tool 102 may provide a flow-in of the gas mixture 1006 into the processing chamber. The gas mixture 1006 includes a cobalt precursor and a carrier gas such as argon (Ar) or another inert gas. The cobalt precursor in the gas mixture 1006 is deposited onto the nitrogenized bottom surface 912. The gas mixture 1006 is then purged from the processing chamber using a purge gas such as argon (Ar), helium (He), hydrogen (H$_2$), and/or another inert gas.

Figure 10D:

As shown in FIG. 10D, the surface treatment operation may result in the formation of the diffusion barrier layer 916. In particular, the cobalt precursor may react with the nitrogenized bottom surface 912 through the one or more processing cycles to build or grow the cobalt nitride diffusion barrier layer 916 over and/or on the ruthenium of the bottom surface 912. The reaction may be selective in that the hydrazine does not react with the oxide material of the dielectric layer 904. Accordingly, the diffusion barrier layer 916 may be omitted from the sidewalls 910.

Figure 10E:
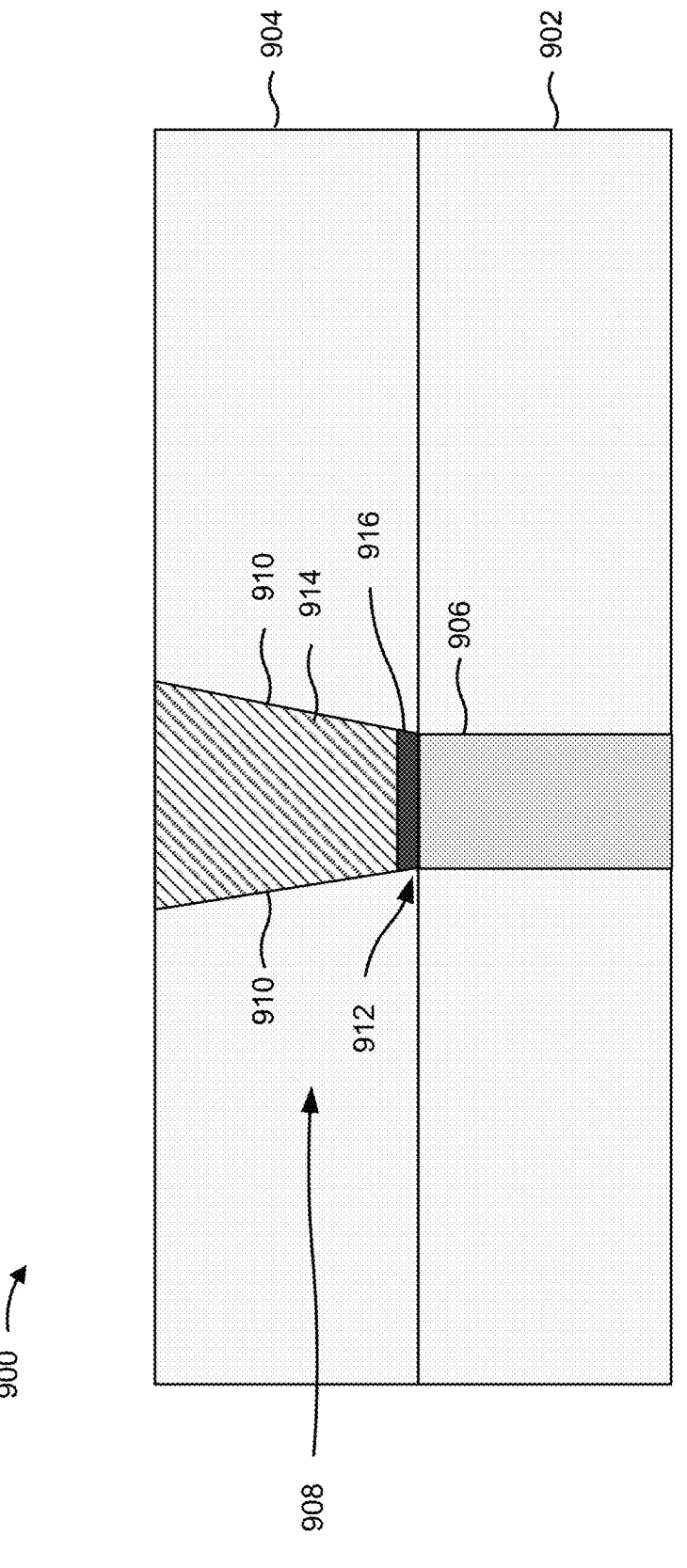

As shown in FIG. 10E, the layer 914 of the interconnect structure 908 may be formed in the remaining volume of the opening 1002 over the cobalt nitride diffusion barrier layer 916. The deposition tool 102 may deposit the cobalt of the layer 914 by a CVD operation, an ALD operation, or another type of deposition operation. The planarization tool 110 may perform a CMP operation to planarize the layer 914 after the cobalt is deposited.

As indicated above, FIGS. 10A-10E are provided as an example. Other examples may differ from what is described with regard to FIGS. 10A-10E.

Figure 11:
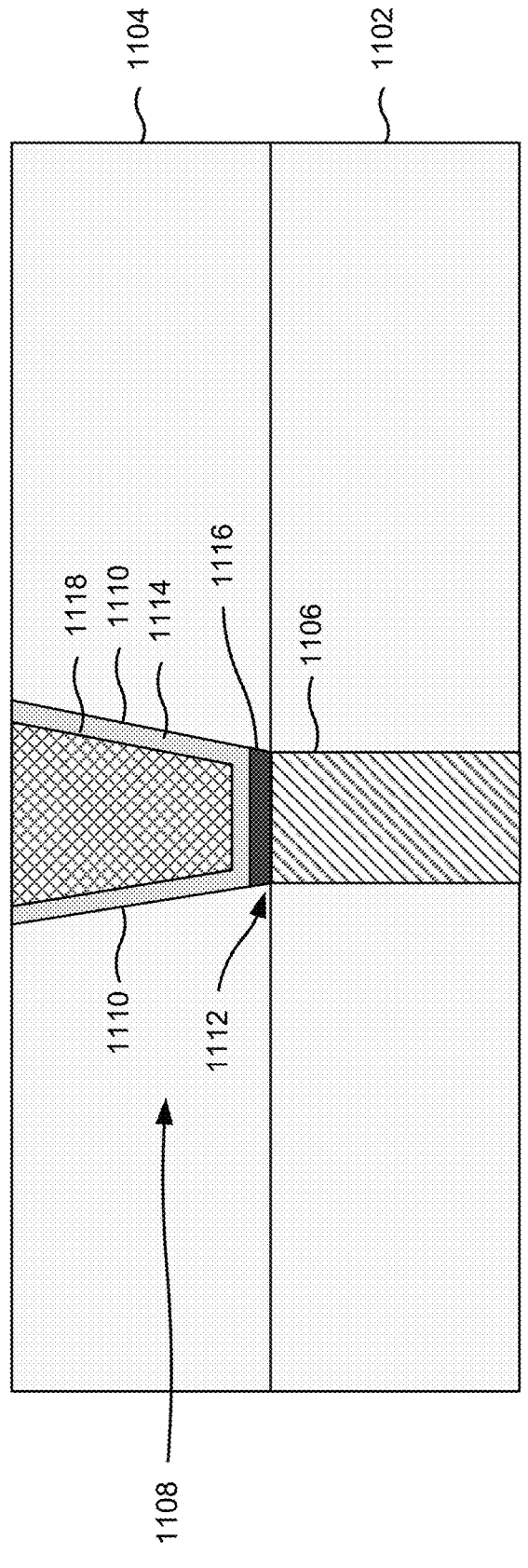
FIG. 11 is a diagram of an example portion of an electronic device described herein.

FIG. 11 is a diagram of an example portion 1100 of an electronic device described herein. The example portion 1100 may include a portion of the electronic device 200 and/or a portion of another type of electronic device. The example portion 1100 may include elements 1102-1114, which may be similar to the elements 302-316 of the example portion 300 of FIG. 3 or the elements 702-716 of the example portion 700 of FIG. 7. However, in the example portion 1100, the interconnect structure 1108 includes a ruthenium (Ru) liner 1114 over and/or on the diffusion barrier layer 1116 (which may include a cobalt nitride (CoN$_x$) or a ruthenium nitride (RuN$_x$)) and over and/or on the sidewalls 1110. Moreover, the interconnect structure 1108 includes a copper layer 1118 over and/or on the ruthenium liner 1114. The ruthenium liner 1114 increases the ability of the copper layer 1118 to reflow when forming the copper layer 1118, and the diffusion barrier layer 1116 reduces, minimizes, and/or prevents the cobalt (Co) in the conductive structure 1106 from diffusing and intermixing into the ruthenium of the ruthenium liner 1114. In this way, copper may be used as an interconnect material in various regions of the electronic device 200.

The ruthenium on cobalt configuration illustrated in FIG. 11 may be included in various areas of the electronic device 200. As an example, the ruthenium liner 1114 and the interconnect structure 1108 may include an M0 metallization layer (e.g., the conductive structure 244 or 246) and the cobalt conductive structure 1106 may include a VD or a VG interconnect (e.g., a source or drain interconnect 238 or a gate interconnect 240). As another example, the cobalt conductive structure 1106 may include an M0 metallization layer (e.g., the conductive structure 244 or 246) and the ruthenium liner 1114 and the interconnect structure 1108 may include a V0 interconnect (or a liner of a V0 interconnect) (e.g., the via 248 or 250).

As indicated above, FIG. 11 is provided as an example. Other examples may differ from what is described with regard to FIG. 11.

Figure 12A:
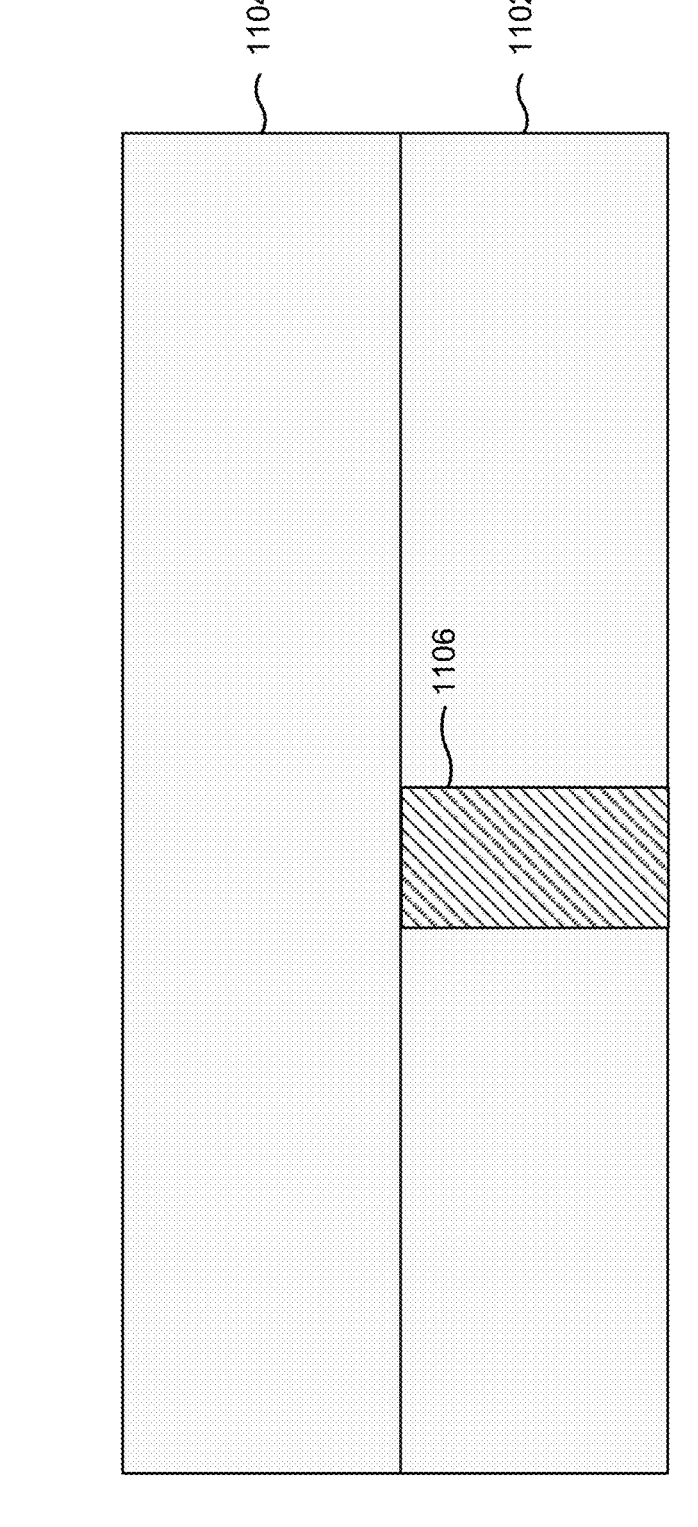
FIGS. 12A-12E are diagrams of an example implementation described herein.

FIGS. 12A-12E are diagrams of an example implementation 1200 described herein. The example implementation 1200 may be an example of forming the interconnect structure 1108 of the example portion 1100 of the electronic device 200. In some implementations, one or more of the semiconductor processing tools 102-112 perform one or more of the processes and/or operations described in connection with FIGS. 12A-12E. Turning to FIG. 12A, the interconnect structure 1108 may be formed in the dielectric layer 1104 above the conductive structure 1106, which is included in the dielectric layer 1102. The conductive structure 1106 may be formed by various semiconductor processing techniques, such as lithography patterning, etching, deposition, electroplating, and/or other semiconductor processing techniques.

Figure 12B:
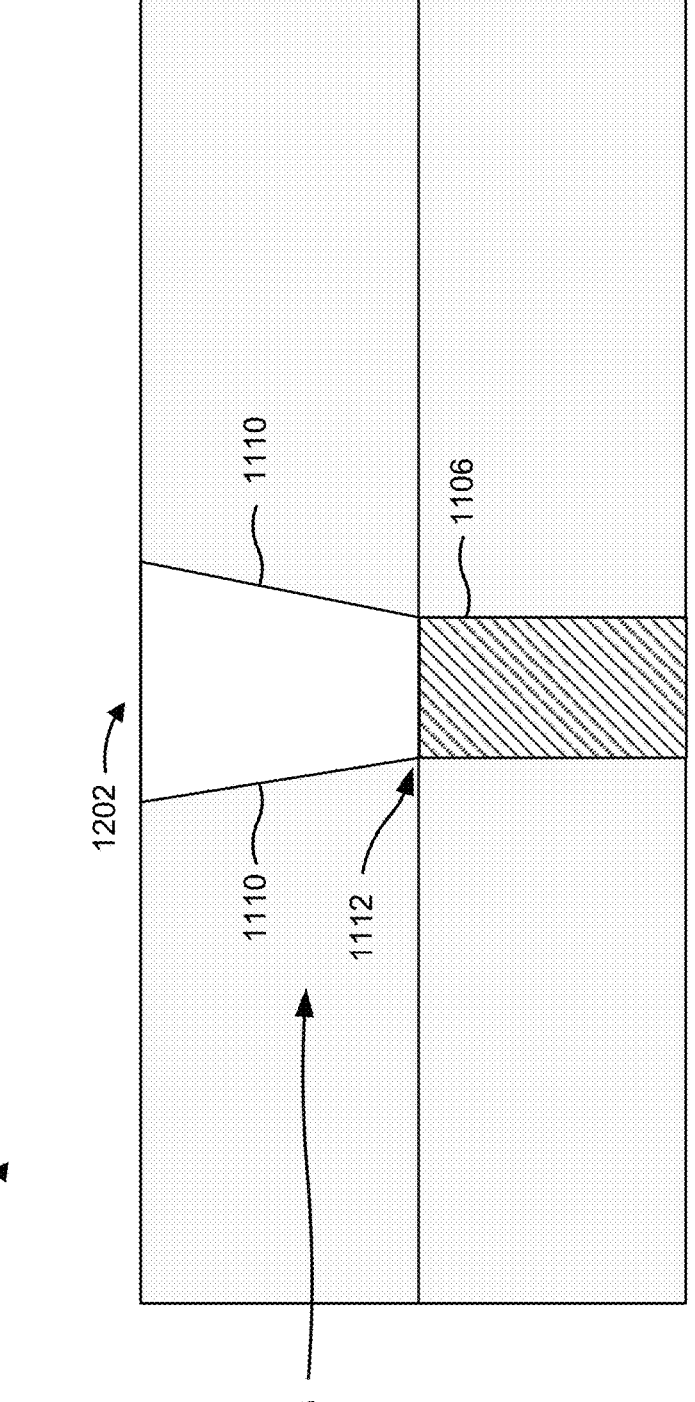

As shown in FIG. 12B, an opening 1202 may be formed in and through the dielectric layer 1104 to form the interconnect structure 1108. The opening 1202 may include a recess, a trench, a via, a hole, or another type of opening through the dielectric layer 1104. The opening 1202 may be formed from a top surface of the dielectric layer 1104 through the dielectric layer 1104, and to the top surface of the conductive structure 1106. The opening 1202 may include sidewalls and a bottom surface corresponding to the sidewalls 1110 of the interconnect structure 1108 and the bottom surface 1112 of the interconnect structure 1108, respectively. The opening 1202 may be formed in a similar manner as the opening 402 described above in connection with FIGS. 4A-4E.

Figure 12C:
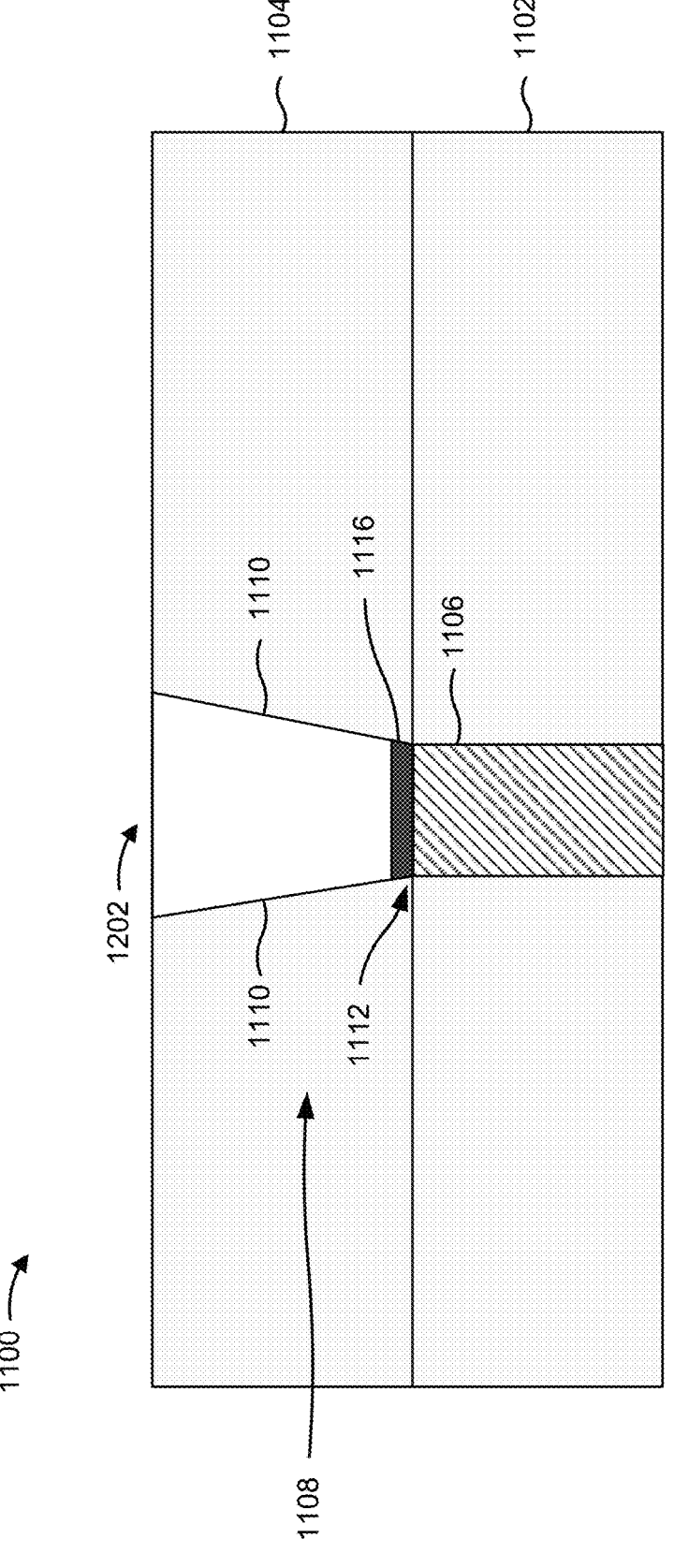

As shown in FIG. 12C, a surface treatment operation may be performed on the bottom surface 1112 to form the diffusion barrier layer 1116 on the bottom surface 1112. In some implementations, the diffusion barrier layer 1116 includes a cobalt nitride (CoN$_x$) formed on the cobalt conductive structure 1106, and the deposition tool 102 performs the surface treatment operation according to the surface treatment techniques described above in FIGS. 4A-4E. In some implementations, the diffusion barrier layer 1116 includes a ruthenium nitride (RuN$_x$) formed on the cobalt conductive structure 1106, and the deposition tool 102 performs the surface treatment operation according to the surface treatment techniques described above in FIGS. 8A-8E.

Figure 12D:
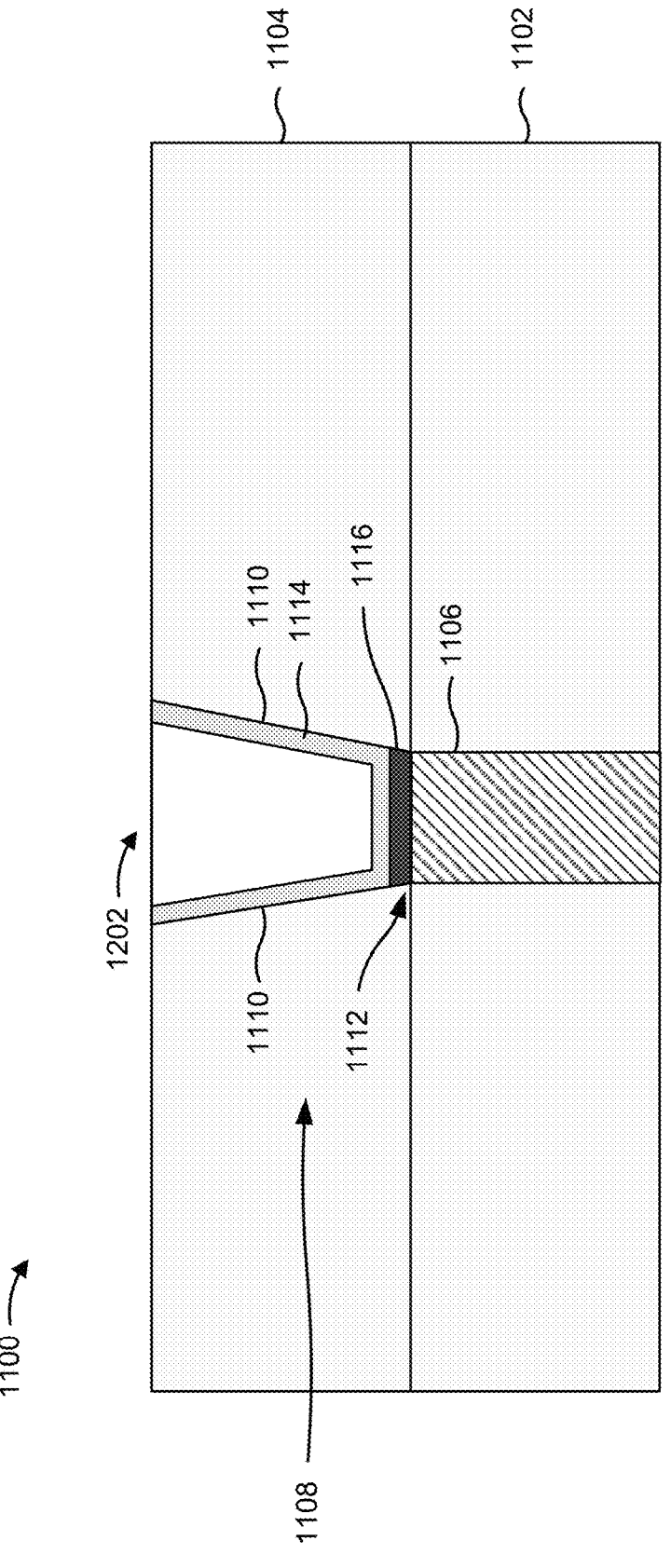

As shown in FIG. 12D, the ruthenium liner 1114 of the interconnect structure 1108 may be formed in the opening 1202 over and/or on the sidewalls 1110 and over and/or on the diffusion barrier layer 1116. The deposition tool 102 may deposit the ruthenium liner 1114 by a CVD operation, an ALD operation, or another type of deposition operation.

Figure 12E:
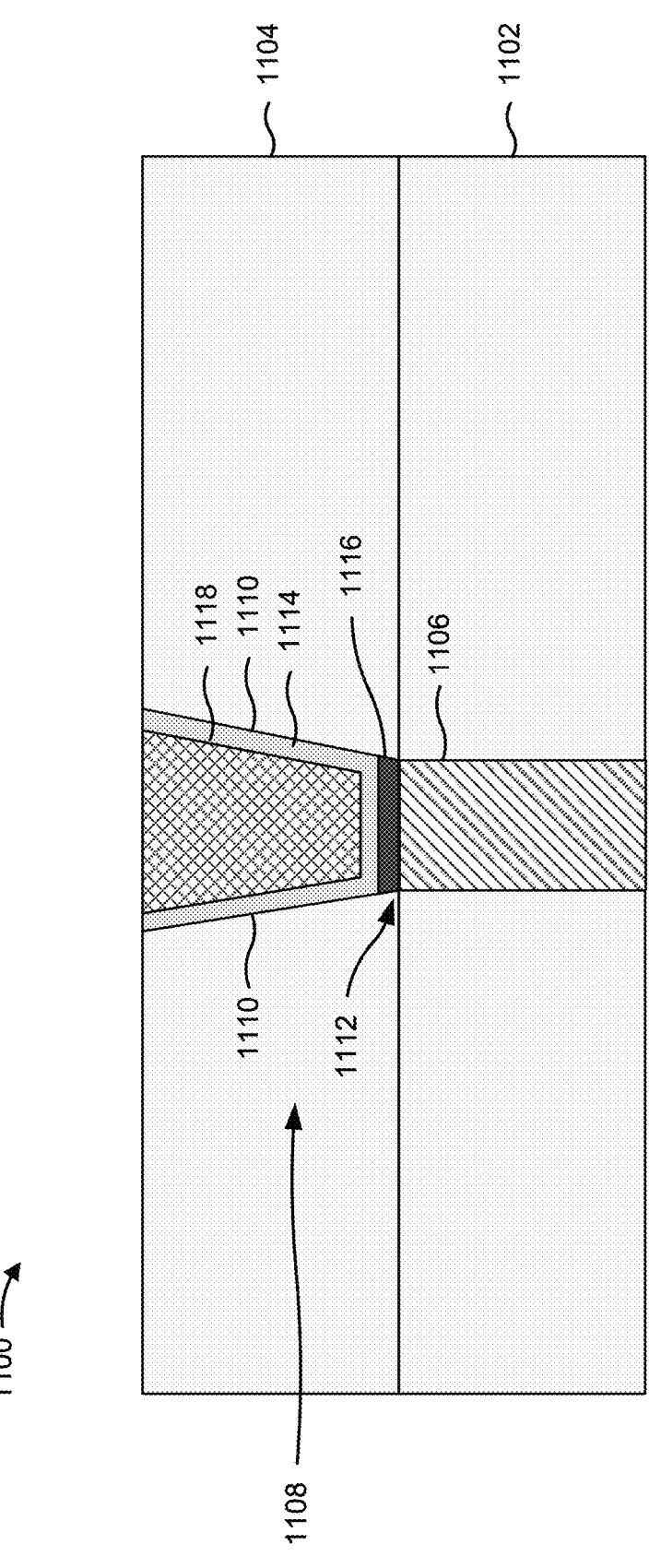

As shown in FIG. 12E, the copper layer 1118 of the interconnect structure 1108 may be formed in the remaining volume of the opening 1202 over and/or on the ruthenium liner 1114. The plating tool 112 may perform a plating operation (e.g., an electroplating operation or an electroless plating operation) to cause copper ions to grow the copper layer 1118 over the ruthenium liner 1114 in the opening 1202. In some implementations, formation of the copper layer 1118 includes a PVD operation to deposit a copper seed layer on the ruthenium liner 1114 in the opening 1202, and then the remaining copper may be deposit onto the copper seed layer in the plating operation. In some implementations, a reflow operation is performed after the plating operation. The reflow operation may include heating the copper layer 1118 to permit the copper layer 1118 to flow. The ruthenium liner 1114 may facilitate and increase the ability of the copper layer 1118 to reflow. This permits the copper layer 1118 to fill any voids or eliminate any material islands that may have been formed during the plating operation. The planarization tool 110 may perform a CMP operation to planarize the copper layer 1118 after the plating operation and after the reflow operation.

As indicated above, FIGS. 12A-12E are provided as an example. Other examples may differ from what is described with regard to FIGS. 12A-12E.

Figure 13:
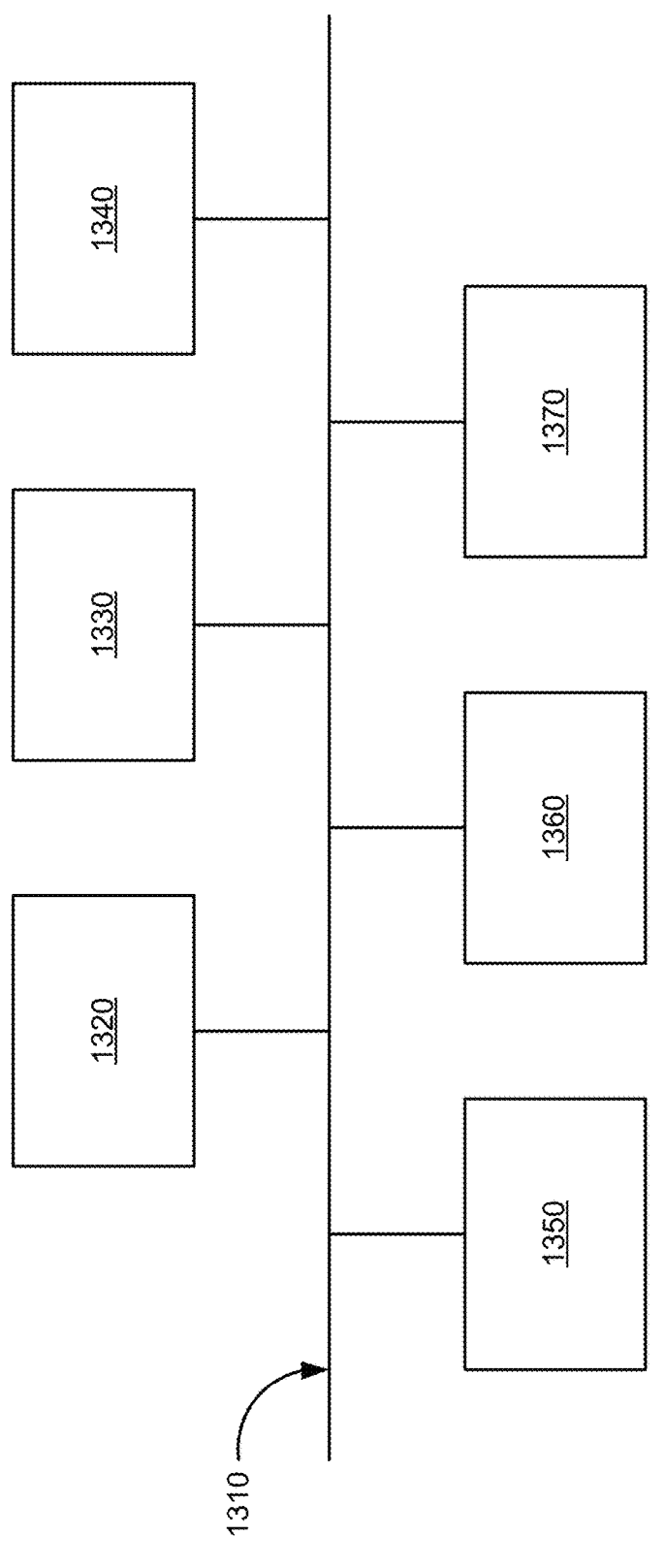
FIG. 13 is a diagram of example components of one or more devices of FIG. 1.

FIG. 13 is a diagram of example components of a device 1300. In some implementations, one or more of the semiconductor processing tools 102-112 and/or the wafer/die transport tool 114 may include one or more devices 1300 and/or one or more components of device 1300. As shown in FIG. 13, device 1300 may include a bus 1310, a processor 1320, a memory 1330, a storage component 1340, an input component 1350, an output component 1360, and a communication component 1370.

Bus 1310 includes a component that enables wired and/or wireless communication among the components of device 1300. Processor 1320 includes a central processing unit, a graphics processing unit, a microprocessor, a controller, a microcontroller, a digital signal processor, a field-programmable gate array, an application-specific integrated circuit, and/or another type of processing component. Processor 1320 is implemented in hardware, firmware, or a combination of hardware and software. In some implementations, processor 1320 includes one or more processors capable of being programmed to perform a function. Memory 1330 includes a random access memory, a read only memory, and/or another type of memory (e.g., a flash memory, a magnetic memory, and/or an optical memory).

Storage component 1340 stores information and/or software related to the operation of device 1300. For example, storage component 1340 may include a hard disk drive, a magnetic disk drive, an optical disk drive, a solid state disk drive, a compact disc, a digital versatile disc, and/or another type of non-transitory computer-readable medium. Input component 1350 enables device 1300 to receive input, such as user input and/or sensed inputs. For example, input component 1350 may include a touch screen, a keyboard, a keypad, a mouse, a button, a microphone, a switch, a sensor, a global positioning system component, an accelerometer, a gyroscope, and/or an actuator. Output component 1360 enables device 1300 to provide output, such as via a display, a speaker, and/or one or more light-emitting diodes. Communication component 1370 enables device 1300 to communicate with other devices, such as via a wired connection and/or a wireless connection. For example, communication component 1370 may include a receiver, a transmitter, a transceiver, a modem, a network interface card, and/or an antenna.

Device 1300 may perform one or more processes described herein. For example, a non-transitory computer-readable medium (e.g., memory 1330 and/or storage component 1340) may store a set of instructions (e.g., one or more instructions, code, software code, and/or program code) for execution by processor 1320. Processor 1320 may execute the set of instructions to perform one or more processes described herein. In some implementations, execution of the set of instructions, by one or more processors 1320, causes the one or more processors 1320 and/or the device 1300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 13 are provided as an example. Device 1300 may include additional components, fewer components, different components, or differently arranged components than those shown in FIG. 13. Additionally, or alternatively, a set of components (e.g., one or more components) of device 1300 may perform one or more functions described as being performed by another set of components of device 1300.

Figure 14:
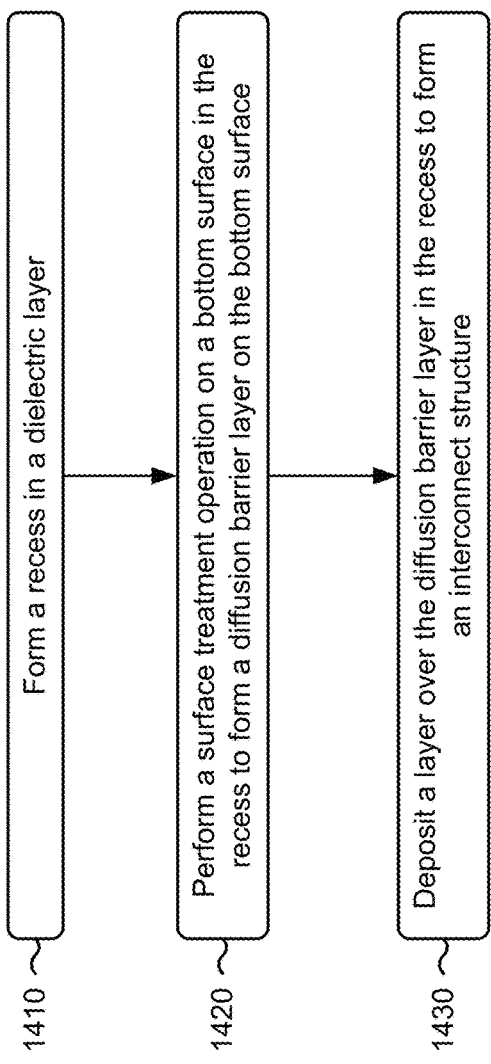
FIGS. 14 and 15 are flowcharts of example processes relating to forming an interconnect structure.

FIG. 14 is a flowchart of an example process 1400 associated with forming an interconnect structure. In some implementations, one or more process blocks of FIG. 14 may be performed by one or more of the semiconductor processing tools (e.g., one or more of the semiconductor processing tools 102-112). Additionally, or alternatively, one or more process blocks of FIG. 14 may be performed by one or more components of device 1300, such as processor 1320, memory 1330, storage component 1340, input component 1350, output component 1360, and/or communication component 1370.

As shown in FIG. 14, process 1400 may include forming a recess in a dielectric layer (block 1410). For example, one or more of the semiconductor processing tools 102-112 may form a recess (e.g., the opening 402, 602, and/or 1202) in a dielectric layer (e.g., the dielectric layer 206, 210, 214, 218, 222, 226, 304, 504, and/or 1104) of a device (e.g., the device 200), as described above. In some implementations, the recess is formed over a conductive structure (e.g., a metal source or drain contact 230, a gate 232, an interconnect (e.g., a source or drain interconnect 238 or a gate interconnect 240), a conductive structure 244 or 246, a via 248 or 250, a conductive structure 252 or 254) such that a bottom surface (e.g., the bottom surface 312, 512, and/or 1112) in the recess is located at an interface between the recess and the conductive structure. In some implementations, the conductive structure includes a first material.

As further shown in FIG. 14, process 1400 may include performing a surface treatment operation on a bottom surface in the recess to form a diffusion barrier layer on the bottom surface (block 1420). For example, one or more of the semiconductor processing tools 102-112 may perform a surface treatment operation on the bottom surface in the recess using hydrazine ($N_2H_4$) (e.g., hydrazine in the gas mixture 404 and/or the gas mixture 604) to form a diffusion barrier layer (e.g., the diffusion barrier layer 316, 516, and/or 1116) on the bottom surface, as described above. In some implementations, the diffusion barrier layer includes a nitride of the first material.

As further shown in FIG. 14, process 1400 may include depositing a layer over the diffusion barrier layer in the recess to form an interconnect structure (block 1430). For example, one or more of the semiconductor processing tools 102-112 may deposit a layer (e.g., the layer 314, 514, and/or 1114) of a second material over the diffusion barrier layer in the recess to form an interconnect structure (e.g., a source or drain interconnect 238 or a gate interconnect 240, a conductive structure 244 or 246, a via 248 or 250, a conductive structure 252 or 254, the interconnect structure 308, the interconnect structure 508, and/or the interconnect structure 1108) over the conductive structure, as described above.

Process 1400 may include additional implementations, such as any single implementation or any combination of implementations described below and/or in connection with one or more other processes described elsewhere herein.

In a first implementation, performing the surface treatment operation includes performing the surface treatment operation for a time duration in a range of approximately 10 seconds to approximately 4 minutes. In a second implementation, alone or in combination with the first implementation, nitrogen (N) in the hydrazine diffuses into a portion of the conductive structure to form the nitride of the first material over the conductive structure. In a third implementation, alone or in combination with one or more of the first and second implementations, performing the surface treatment operation includes introducing the hydrazine into the recess using a carrier gas, where a ratio between the carrier gas and the hydrazine is in a range of approximately 10:1 to approximately 100:1.

In a fourth implementation, alone or in combination with one or more of the first through third implementations, performing the surface treatment operation includes performing the surface treatment operation to form the diffusion barrier layer to a thickness in a range of approximately 0.3 nanometers to approximately 5 nanometers. In a fifth implementation, alone or in combination with one or more of the first through fourth implementations, performing the surface treatment operation includes performing the surface treatment operation at a temperature in a range of approximately 100 degrees Celsius to approximately 400 degrees Celsius. In a sixth implementation, alone or in combination with one or more of the first through fifth implementations, the first material includes cobalt (Co), the nitride of the first material includes a cobalt nitride ($CoN_x$), and the second material includes ruthenium (Ru).

In a seventh implementation, alone or in combination with one or more of the first through sixth implementations, the layer of the second material includes a ruthenium (Ru) liner, and the process 1400 includes forming a copper (Cu) layer 1118 over the ruthenium liner as part of the interconnect structure. In an eighth implementation, alone or in combination with one or more of the first through seventh implementations, the first material includes ruthenium (Ru), the nitride of the first material includes a ruthenium nitride ($RuN_x$), and the second material includes cobalt (Co).

Although FIG. 14 shows example blocks of process 1400, in some implementations, process 1400 may include additional blocks, fewer blocks, different blocks, or differently arranged blocks than those depicted in FIG. 14. Additionally, or alternatively, two or more of the blocks of process 1400 may be performed in parallel.

Figure 15:
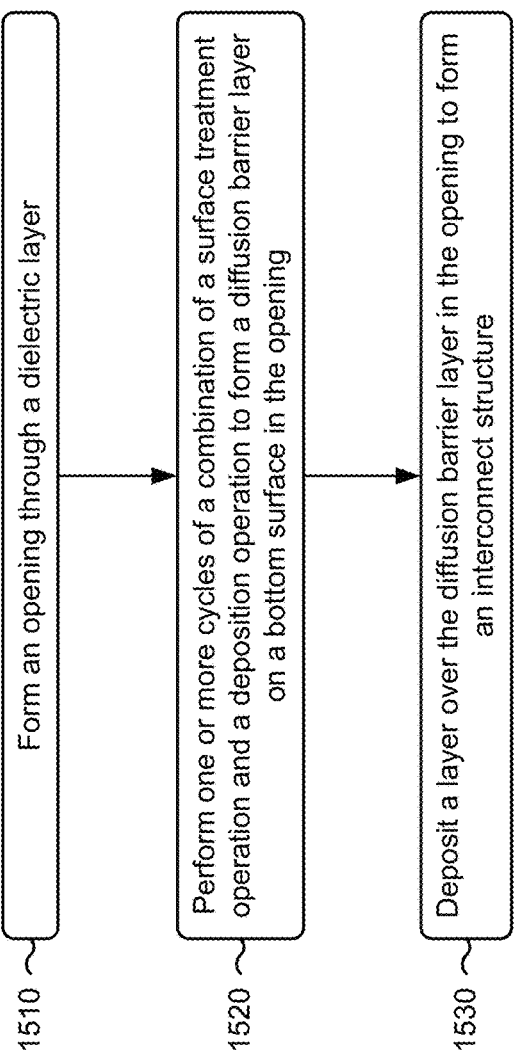

FIG. 15 is a flowchart of an example process 1500 associated with forming an interconnect structure. In some implementations, one or more process blocks of FIG. 15 may be performed by one or more of the semiconductor processing tools (e.g., one or more of the semiconductor processing tools 102-112). Additionally, or alternatively, one or more process blocks of FIG. 15 may be performed by one or more components of device 1300, such as processor 1320, memory 1330, storage component 1340, input component 1350, output component 1360, and/or communication component 1370.

As shown in FIG. 15, process 1500 may include forming an opening through a dielectric layer (block 1510). For example, one or more of the semiconductor processing tools 102-112 may form an opening (e.g., the opening 802, 1002) through a first dielectric layer (e.g., the dielectric layer 206, 210, 214, 218, 222, 226, 704, and/or 904) of a device (e.g., the device 200) to a conductive structure (e.g., a source or drain contact 230, a gate 232, a source or drain interconnect 238, a gate interconnect 240, a conductive structure 244 or 246, a via 248 or 250, a conductive structure 252 or 254, the conductive structure 706, and/or the conductive structure 906) in a second dielectric layer (e.g., the dielectric layer 206, 210, 214, 218, 222, 226, 702, and/or 902) of the device, as described above. In some implementations, the conductive structure includes a first material.

As further shown in FIG. 15, process 1500 may include performing one or more cycles of a combination of a surface treatment operation and a deposition operation to form a diffusion barrier layer on a bottom surface in the opening (block 1520). For example, one or more of the semiconductor processing tools 102-112 may perform, to form a diffusion barrier layer (e.g., the diffusion barrier layer 716 and/or 916) on a bottom surface (e.g., the bottom surface 712 and/or 912) in the opening, one or more cycles of a combination of a surface treatment operation on the bottom surface and a deposition operation of a precursor of a second material after the surface treatment operation, as described above. In some implementations, the diffusion barrier layer includes a nitride of the second material.

As further shown in FIG. 15, process 1500 may include depositing a layer over the diffusion barrier layer in the opening to form an interconnect structure (block 1530). For example, one or more of the semiconductor processing tools 102-112 may deposit a layer (e.g., the layer 714 and/or 914) of the second material over the diffusion barrier layer in the opening to form an interconnect structure (e.g., a source or drain interconnect 238 or a gate interconnect 240, a conductive structure 244 or 246, a via 248 or 250, a conductive structure 252 or 254, the interconnect structure 708 and/or 908) over the conductive structure, as described above.

Process 1500 may include additional implementations, such as any single implementation or any combination of implementations described below and/or in connection with one or more other processes described elsewhere herein.

In a first implementation, the surface treatment operation includes treating the bottom surface in the opening with hydrazine to form a nitrogenized bottom surface. In a second implementation, alone or in combination with the first implementation, the deposition operation includes depositing the precursor of the second material on the nitrogenized bottom surface, where the precursor of the second material reacts with the nitrogenized bottom surface to form the diffusion barrier layer. In a third implementation, alone or in combination with one or more of the first and second implementations, performing the one or more cycles includes performing a cycle of the one or more cycles to form a portion of the diffusion barrier layer to a thickness in a range of approximately 0.25 nanometers to approximately 1 nanometer.

In a fourth implementation, alone or in combination with one or more of the first through third implementations, a quantity of the one or more cycles is in a range of 2 cycles to 20 cycles. In a fifth implementation, alone or in combination with one or more of the first through fourth implementations, the deposition operation includes depositing the precursor of the second material into the opening using a carrier gas, wherein a ratio between the carrier gas and the precursor of the second material is in a range of approximately 10:1 to approximately 200:1.

In a sixth implementation, alone or in combination with one or more of the first through fifth implementations, the first material includes cobalt (Co), the second material includes ruthenium (Ru), the nitride of the second material includes a ruthenium nitride ($RuN_x$), and the diffusion barrier layer is formed to prevent diffusion of the cobalt into the interconnect structure. In a seventh implementation, alone or in combination with one or more of the first through sixth implementations, the first material includes ruthenium (Ru), the second material includes cobalt (Co), the nitride of the second material includes a cobalt nitride ($CoN_x$), and the diffusion barrier layer is formed to prevent diffusion of the cobalt into the conductive structure.

Although FIG. 15 shows example blocks of process 1500, in some implementations, process 1500 may include additional blocks, fewer blocks, different blocks, or differently arranged blocks than those depicted in FIG. 15. Additionally, or alternatively, two or more of the blocks of process 1500 may be performed in parallel.

In this way, metal nitride diffusion barriers may be included between cobalt-based structures and ruthenium-based structures to reduce, minimize, and/or prevent inter-mixing of cobalt into ruthenium. A metal nitride diffusion barrier layer may include a cobalt nitride ($CoN_x$), a ruthenium nitride ($RuN_x$), or another metal nitride that has a bond dissociation energy greater than the bond dissociation energy of cobalt to cobalt (Co—Co), and may therefore function as a strong barrier to cobalt migration and diffusion into ruthenium. Moreover, cobalt nitride and ruthenium nitride have lower resistivity relative to other materials such as titanium nitride (TiN), tungsten nitride (WN), and tantalum nitride (TaN). In this way, the metal nitride diffusion barriers are capable of minimizing cobalt diffusion and intermixing into ruthenium-based interconnect structures while maintaining a low contact resistance for the interconnect structures. This may increase semiconductor device performance, may increase semiconductor device yield, and may enable further reductions in interconnect structure size.

As described in greater detail above, some implementations described herein provide a method. The method includes forming a recess in a dielectric layer of a device, where the recess is formed over a conductive structure such that a bottom surface in the recess is located at an interface between the recess and the conductive structure, and where the conductive structure includes a first material. The method includes performing a surface treatment operation on the bottom surface in the recess using hydrazine to form a diffusion barrier layer on the bottom surface, where the diffusion barrier layer comprises a nitride of the first material. The method includes depositing a layer of a second material over the diffusion barrier layer in the recess to form an interconnect structure over the conductive structure.

As described in greater detail above, some implementations described herein provide a method. The method includes forming an opening through a first dielectric layer of a device to a conductive structure in a second dielectric layer of the device, where the conductive structure includes a first material. The method includes performing, to form a diffusion barrier layer on a bottom surface in the opening, one or more cycles of a combination of a surface treatment operation on the bottom surface and a deposition operation of a precursor of a second material after the surface treatment operation, where the diffusion barrier layer includes a nitride of the second material. The method includes depositing a layer of the second material over the diffusion barrier layer in the opening to form an interconnect structure over the conductive structure.

As described in greater detail above, some implementations described herein provide a device. The device includes a conductive structure, included in a first dielectric layer of the device, comprising a first conductive material. The device includes an interconnect structure, included in a second dielectric layer of the device, comprising a layer of a second conductive material. The device includes a diffusion barrier layer, between the conductive structure and the interconnect structure, comprising a nitride of the first conductive material or a nitride of the second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a recess in a dielectric layer of a device,
      wherein the recess is formed over a cobalt conductive structure such that a bottom surface in the recess is a top surface of the cobalt conductive structure;
   performing a surface treatment operation, at a temperature in a range of approximately 100 degrees Celsius to approximately 400 degrees Celsius, on the cobalt conductive structure using hydrazine to form a cobalt nitride on the top surface of the cobalt conductive structure,
      wherein the hydrazine reacts with cobalt in the cobalt conductive structure to form the cobalt nitride on the top surface of the cobalt conductive structure, and
      wherein performing the surface treatment operation comprises:
         introducing the hydrazine into the recess using a carrier gas,
            wherein a ratio between the carrier gas and the hydrazine is in a range of approximately 10:1 to approximately 100:1; and
   depositing a layer of ruthenium directly on the cobalt nitride in the recess to form an interconnect structure over the cobalt conductive structure.

2. The method of claim 1, wherein performing the surface treatment operation comprises:
   performing the surface treatment operation for a time duration in a range of approximately 10 seconds to approximately 4 minutes.

3. The method of claim 1, wherein nitrogen in the hydrazine diffuses into the cobalt in the cobalt conductive structure to form the cobalt nitride on the top surface of the cobalt conductive structure.

4. The method of claim 1, wherein performing the surface treatment operation comprises:

performing the surface treatment operation to form the cobalt nitride to a thickness in a range of approximately 0.3 nanometers to approximately 5 nanometers.

5. The method of claim 1, wherein the layer of ruthenium comprises a ruthenium liner; and wherein the method further comprises:

forming a copper layer in the recess and directly on the ruthenium liner as part of the interconnect structure.

6. A method, comprising:

forming an opening through a first dielectric layer of a device to a cobalt conductive structure in a second dielectric layer of the device;

performing, to form a ruthenium nitride on a bottom surface in the opening, one or more cycles of a combination of:

a surface treatment operation, at a temperature in a range of approximately 100 degrees Celsius to approximately 400 degrees Celsius, on the bottom surface in the opening, and a deposition operation of a precursor of ruthenium after the surface treatment operation, wherein the ruthenium nitride forms a diffusion barrier layer on a top surface of the cobalt conductive structure, wherein performing the surface treatment operation comprises:

introducing hydrazine into the opening using a carrier gas, wherein a ratio between the carrier gas and the hydrazine is in a range of approximately 10:1 to approximately 100:1, and wherein performing the deposition operation comprises:

depositing the precursor of ruthenium into the opening using the carrier gas, wherein a ratio between the carrier gas and the precursor of ruthenium is in a range of approximately 10:1 to approximately 200:1, and depositing a layer of ruthenium directly on the ruthenium nitride in the opening to form an interconnect structure over the cobalt conductive structure.

7. The method of claim 6, wherein performing the surface treatment operation comprises:

treating the bottom surface in the opening with the hydrazine to form a nitrogenized bottom surface.

8. The method of claim 7, wherein performing the deposition operation comprises:

depositing the precursor of ruthenium on the nitrogenized bottom surface, wherein the precursor of ruthenium reacts with the nitrogenized bottom surface to form the ruthenium nitride.

9. The method of claim 6, wherein performing the one or more cycles comprises:

performing a cycle of the one or more cycles to form a portion of the ruthenium nitride to a thickness in a range of approximately 0.25 nanometers to approximately 1 nanometer.

10. The method of claim 6, wherein a quantity of the one or more cycles is in a range of 2 cycles to 20 cycles.

11. The method of claim 6, wherein the diffusion barrier layer is formed to prevent diffusion of the cobalt, in the cobalt conductive structure, into the interconnect structure.

12. The method of claim 6, wherein depositing the layer of ruthenium directly on the ruthenium nitride comprises:

depositing a ruthenium liner directly on the ruthenium nitride.

13. The method of claim 12, further comprising:

depositing another material directly on the ruthenium liner to form the interconnect structure.

14. The method of claim 13, wherein the other material is copper.

15. A method, comprising:

forming a cobalt conductive structure in a first dielectric layer;

forming a second dielectric layer on the cobalt conductive structure and the first dielectric layer;

forming a recess in the second dielectric layer and over the cobalt conductive structure, wherein a bottom surface of the recess is a top surface of the cobalt conductive structure;

forming a cobalt nitride on the top surface of the cobalt conductive structure by performing a surface treatment operation, at a temperature in a range of approximately 100 degrees Celsius to approximately 400 degrees Celsius, on the cobalt conductive structure in the recess using hydrazine, wherein the hydrazine reacts with the cobalt in the cobalt conductive structure to form the cobalt nitride on the top surface of the cobalt conductive structure, and wherein performing the surface treatment operation comprises:

introducing the hydrazine into the recess using a carrier gas, wherein a ratio between the carrier gas and the hydrazine is in a range of approximately 10:1 to approximately 100:1; and depositing a layer of ruthenium directly on the cobalt nitride to form an interconnect structure over the cobalt conductive structure.

16. The method of claim 15, wherein depositing the layer of ruthenium directly on the cobalt nitride comprises:

depositing a ruthenium liner directly on the cobalt nitride.

17. The method of claim 16, wherein the ruthenium liner is further formed on sidewalls of the recess.

18. The method of claim 16, further comprising:

depositing another material in the recess and directly on the ruthenium liner to form the interconnect structure.

19. The method of claim 18, wherein the other material is copper.

20. The method of claim 16, further comprising:

forming a copper layer on the ruthenium liner by causing copper ions to grow the copper layer in the recess.

\* \* \* \* \*